United States Patent
Lee et al.

(10) Patent No.: US 12,402,514 B2
(45) Date of Patent: Aug. 26, 2025

(54) ELECTROLUMINESCENCE DISPLAY

(71) Applicant: LG Display Co., Ltd., Seoul (KR)

(72) Inventors: Geumyoung Lee, Paju-si (KR); JeongOh Kim, Paju-si (KR); SungHo Lee, Paju-si (KR); SeongHo Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 215 days.

(21) Appl. No.: 17/472,013

(22) Filed: Sep. 10, 2021

(65) Prior Publication Data

US 2022/0165990 A1 May 26, 2022

(30) Foreign Application Priority Data

Nov. 23, 2020 (KR) .................. 10-2020-0157677

(51) Int. Cl.
 *H10K 59/80* (2023.01)
 *H10K 50/84* (2023.01)
 *H10K 50/844* (2023.01)
 *H10K 59/122* (2023.01)
 *H10K 59/124* (2023.01)

(52) U.S. Cl.
 CPC ......... *H10K 59/873* (2023.02); *H10K 50/844* (2023.02); *H10K 50/846* (2023.02); *H10K 59/874* (2023.02); *H10K 59/122* (2023.02); *H10K 59/124* (2023.02)

(58) Field of Classification Search
 CPC .. H10K 50/846; H10K 50/844; H10K 59/122; H10K 59/124
 See application file for complete search history.

(56) References Cited

U.S. PATENT DOCUMENTS

| | | |
|---|---|---|
| 2007/0247068 A1 | 10/2007 | Park |
| 2016/0307971 A1* | 10/2016 | Jeon .................. H01L 22/30 |
| 2019/0006442 A1* | 1/2019 | Byun .................. H10K 59/124 |
| 2020/0006697 A1 | 1/2020 | Jung |
| 2020/0185647 A1 | 6/2020 | Lee et al. |
| 2020/0212140 A1* | 7/2020 | Huh .................. H10K 59/124 |
| 2021/0013296 A1* | 1/2021 | Ochi .................. H05B 33/04 |

(Continued)

FOREIGN PATENT DOCUMENTS

| | | |
|---|---|---|
| CN | 106057853 A | 10/2016 |
| CN | 111293145 A | 6/2020 |

(Continued)

OTHER PUBLICATIONS

Office Action issued in corresponding Korean Patent Application No. 10-2020-0157677, dated May 2, 2024.

(Continued)

*Primary Examiner* — Shaun M Campbell
(74) *Attorney, Agent, or Firm* — Morgan, Lewis & Bockius LLP

(57) ABSTRACT

The present disclosure relates to an electroluminescence display having a robust structure against the penetration of hydrogen particles. An electroluminescence display may include: a substrate; a driving layer disposed on the substrate; an emission layer disposed on the driving layer; an encapsulation layer disposed on the emission layer; and a dam surrounding a circumference area of the emission layer, the dam including an organic layer and a hydrogen absorbing layer.

3 Claims, 8 Drawing Sheets

(56) References Cited

U.S. PATENT DOCUMENTS

2021/0367027 A1* 11/2021 Okabe .................... H05B 33/06
2023/0130571 A1*  4/2023 Murashige ........... H10K 59/131
                                                          257/40

FOREIGN PATENT DOCUMENTS

| KR | 10-0703458 B1 | 4/2007 |
| KR | 10-2019-0004407 A | 1/2019 |
| KR | 10-2020-0003337 A1 | 1/2020 |
| KR | 10-2020-0036291 A | 4/2020 |
| KR | 20200082764 A | 7/2020 |

OTHER PUBLICATIONS

Office Action dated Nov. 7, 2024 issued in Chinese Patent Application No. 202111355024.5. (Note: US 2016/0307971 A1 and 2020/0185647 A1 cited in this CN Office Action were cited in prior IDS').

* cited by examiner

ELECTROLUMINESCENCE DISPLAY

CROSS-REFERENCE TO RELATED APPLICATIONS

This application claims the benefit of the Korean Patent Application No. 10-2020-0157677 filed on Nov. 23, 2020, which is hereby incorporated by reference as if fully set forth herein.

BACKGROUND

Technical Field

The present disclosure relates to an electroluminescence display device. More particularly, the present disclosure relates to an electroluminescence display device having a robust structure against the penetration of hydrogen particles.

Discussion of the Related Art

Among display devices, an electroluminescence display device is a self-light emitting device, and has advantages in that a viewing angle and a contrast ratio are more excellent than those of other display devices. Further, since the electroluminescence display device does not require a separate backlight, it is advantageous that the electroluminescence display device is able to be thin and lightweight and has low power consumption. Furthermore, an organic light emitting display device of the electroluminescence display device has advantages in that it can be driven at a low direct current voltage, has a fast response speed, and has a low manufacturing cost.

The electroluminescence display device includes a plurality of electroluminescence diodes. The electroluminescence diode includes an anode electrode, a light emitting layer formed on the anode electrode, and a cathode electrode formed on the light emitting layer. If a high potential voltage is applied to the anode electrode and a low potential voltage is applied to the cathode electrode, holes in the anode electrode and electrons in the cathode electrode respectively move to the light emitting layer. When holes and electrons are combined with each other in the light emitting layer, exciton is formed during an excitation process, and light is generated due to the energy from the exciton. The electroluminescence display device displays an image by electrically controlling the amount of light generated from the light emitting layers of the plurality of electroluminescence diodes partitioned by banks.

An encapsulation layer may be included to protect various elements of the electroluminescence display device from oxygen or moisture intruded from outside. The encapsulation layer may have a structure in which inorganic layers and organic layers are alternately stacked. Particularly, as the organic layer of the encapsulation layer may have relatively low viscosity, it is required to control the spreadability when disposing it on the display panel. In order to control the spreadability of the organic layer of the encapsulation layer, a structural element such as a dam may be disposed in the outer area of the electroluminescence display.

Dam may be made of an organic material. There may be a problem that the organic material does not completely block the penetration of moisture or hydrogen particles from the outside. Various methods have been proposed. However, it is required to provide a structure and method for preventing penetration and/or propagation of hydrogen particles into the display element.

SUMMARY

Accordingly, embodiments of the present disclosure are directed to a electroluminescence display that substantially obviates one or more of the problems due to limitations and disadvantages of the related art.

An aspect of the present disclosure is to provide an electroluminescence display device including a dam structure for preventing moisture from intruding from the outside environment. Another aspect of the present disclosure is to provide an electroluminescence display device including a structural element for preventing hydrogen particles from intruding from the outside environment and propagating into the display elements.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an electroluminescence display comprises: a substrate; a driving layer disposed on the substrate; an emission layer disposed on the driving layer; an encapsulation layer disposed on the emission layer; and a dam surrounding a circumference area of the emission layer, the dam including an organic layer and a hydrogen absorbing layer.

In one example, the organic layer includes: a first organic layer; a second organic layer on the first organic layer; and a third organic layer on the second organic layer. The hydrogen absorbing layer includes a first hydrogen absorbing layer contacting an inner wall side, a top side and an outer wall side of the first organic layer.

In one example, the second organic layer covers the first organic layer, and contacts whole outer surface of the first hydrogen absorbing layer.

In one example, the hydrogen absorbing layer further includes a second hydrogen absorbing layer contacting an inner wall side, a top side and an outer wall side of the second organic layer.

In one example, the hydrogen absorbing layer further includes a third hydrogen absorbing layer contacting an inner wall side, a top side and an outer wall side of the third organic layer.

In one example, the organic layer includes: a first organic layer; a second organic layer on the first organic layer; and a third organic layer on the second organic layer. The hydrogen absorbing layer includes a first hydrogen absorbing layer disposed on the driving layer and covered by the first organic layer.

In one example, the hydrogen absorbing layer further includes a second hydrogen absorbing layer disposed on the first organic layer and covered by the second organic layer.

In one example, the hydrogen absorbing layer further includes a vertical hydrogen absorbing layer connecting the first hydrogen absorbing layer and the second hydrogen absorbing layer and penetrating the first organic layer.

In one example, the hydrogen absorbing layer further includes a third hydrogen absorbing layer disposed on the second organic layer and covered by the third organic layer.

In one example, the hydrogen absorbing layer further includes a vertical hydrogen absorbing layer connecting the first hydrogen absorbing layer and the third hydrogen absorbing layer, and penetrating the first organic layer and the second organic layer.

In one example, the hydrogen absorbing layer further includes a second hydrogen absorbing layer contacting an inner wall side, a top side and an outer wall side of the first organic layer.

In one example, the hydrogen absorbing layer includes a plurality of island shapes separated from each other.

In one example, the hydrogen absorbing layer further includes a second hydrogen absorbing layer disposed between a first inorganic layer and a second inorganic layer of the driving layer.

In one example, the hydrogen absorbing layer further includes a vertical hydrogen absorbing layer connecting the first hydrogen absorbing layer and the second hydrogen absorbing layer and penetrating the second inorganic layer.

In one example, the dam includes: an inner dam disposed near to a display area; and an outer dam disposed outside of the inner dam.

In one example, the organic layer includes: a bottom side contacting an upper surface of the driving layer; a top side apart from the bottom side with a predetermined height; an inner wall side connecting the bottom side and the top side; and an outer wall side connecting the bottom side and the top side and facing to the inner wall side. The hydrogen absorbing layer covers the inner wall side, the top side and the outer wall side of the organic layer.

In one example, the organic layer includes: a bottom side contacting an upper surface of the driving layer; a top side apart from the bottom side with a predetermined height; an inner wall side connecting the bottom side and the top side; and an outer wall side connecting the bottom side and the top side and facing to the inner wall side. The hydrogen absorbing layer is disposed between the bottom side of the organic layer and an upper surface of the driving layer.

In one example, the organic layer includes: a bottom side contacting an upper surface of the driving layer; a top side apart from the bottom side with a predetermined height; an inner wall side connecting the bottom side and the top side; and an outer wall side connecting the bottom side and the top side and facing to the inner wall side. The hydrogen absorbing layer has a vertical wall sheet shape penetrating the organic layer from the top side to the bottom side and contacting an upper surface of the driving layer.

The electroluminescence display device according to one embodiment of the present disclosure may include a dam structure having a hydrogen absorbing layer for blocking the intrusion of the hydrogen particles and moisture from outside environment. In addition, even though the hydrogen particle may intrude into the outermost surface of the display, the electroluminescence display device according to one embodiment of the present disclosure may include a hydrogen absorbing layer made of molybdenum, titanium or their alloy metal to prevent the hydrogen particles from propagating to the display elements by absorbing the hydrogen particles. Therefore, the electroluminescence display device according to the present disclosure may prevent damage to organic elements and oxide semiconductor element by penetration and/or propagation of the hydrogen particles and/or moisture from the outside environment.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION

Figure 1:
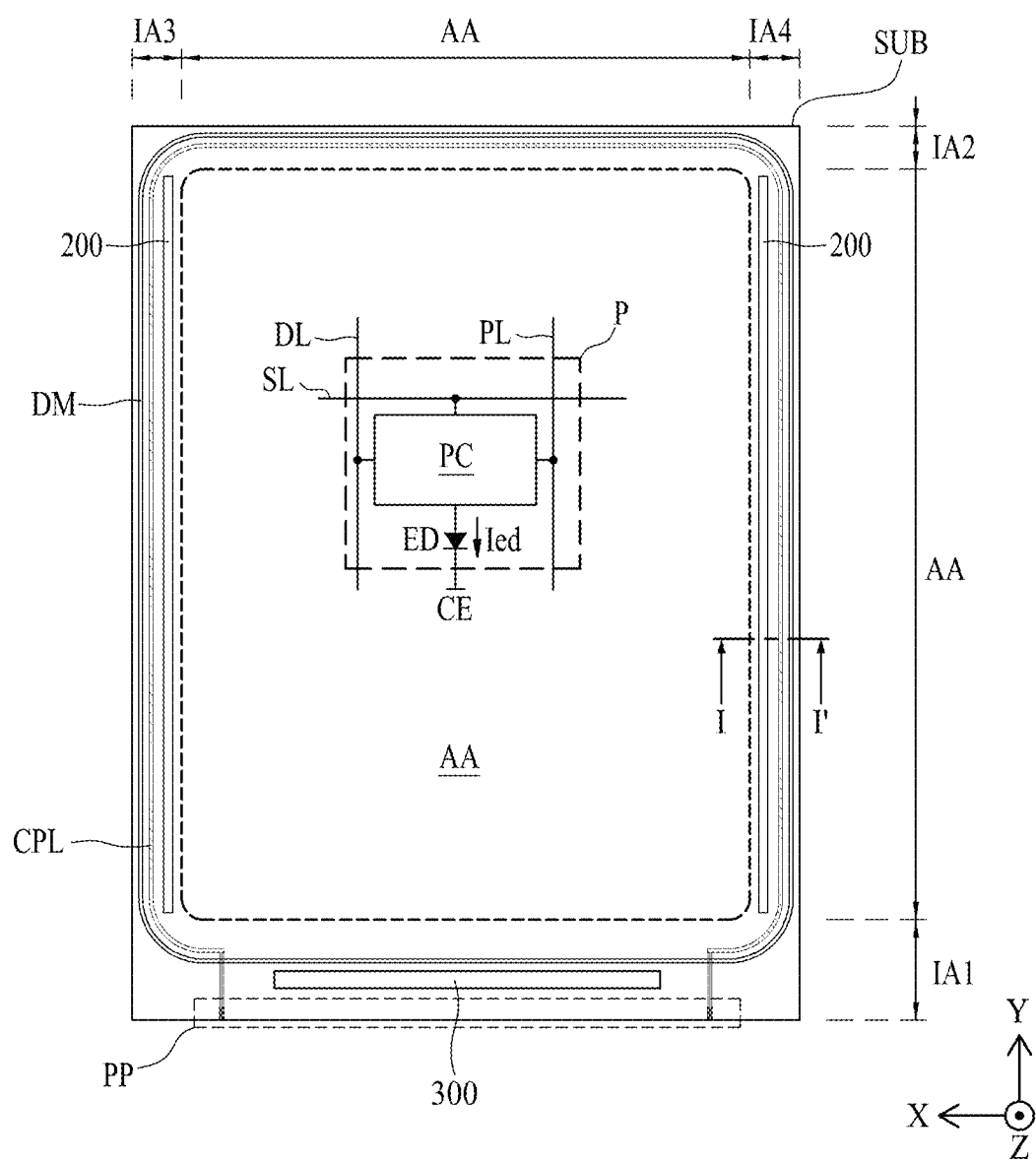
FIG. 1 is a plane view illustrating a structure of an electroluminescence display device according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present disclosure are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next to-', one or more portions can be arranged between two other portions unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, an example of an electroluminescence display device according to the present disclosure will be described in detail with reference to the accompanying drawings. Wherever possible, the same reference numbers will be used throughout the drawings to refer to the same or like parts.

FIG. 1 is a plane view illustrating a structure of an electroluminescence display device according to the present disclosure. Referring to FIG. 1, the electroluminescence display device according to the present disclosure may include a substrate SUB, a pixel P, a common power line CPL, a gate driving circuit 200, a dam DM and a driving integrated circuit 300.

The substrate SUB is a base substrate (or base layer), and includes a plastic material or a glass material. In view of characteristics of a display device, it is preferable that the substrate SUB is transparent. The substrate SUB according to one example can have a rectangular shape, a rounded rectangular shape, each of whose corner portions is rounded with a certain curvature radius, or a non-rectangular shape having at least six sides, on a plane. In this case, the substrate SUB having a non-rectangular shape can include at least one protrusion or at least one notch portion.

The substrate SUB according to one example can be categorized into a display area AA and a non-display area IA. The display area AA is provided at most of center portions of the substrate SUB, and can be defined as an area for displaying an image. The display area AA according to one example can have a rectangular shape, a rounded rectangular shape, each of whose corner portions is rounded with a certain curvature radius, or anon-rectangular shape having at least six sides, on a plane. In this case, the display area AA having a non-rectangular shape can include at least one protrusion or at least one notch portion.

The non-display area IA is provided on an edge area of the substrate SUB to surround the display area AA, and can be defined as an area where an image is not displayed, or a peripheral area. The non-display area IA according to one example can include a first non-display area IA1 provided on a first edge of the substrate SUB, a second non-display area IA2 provided on a second edge of the substrate SUB in parallel with the first non-display area IA1, a third non-display area IA3 provided on a third edge of the substrate SUB, and a fourth non-display area IA4 provided on a fourth edge of the substrate SUB in parallel with the third non-display area IA3. For example, the first non-display area IA1 can be, but is not limited to, an upper (or lower) edge area of the substrate SUB, the second non-display area IA2 can be, but is not limited to, a lower (or upper) edge area of the substrate SUB, the third non-display area IA3 can be, but is not limited to, a left (or right) edge area of the substrate SUB, and the fourth non-display area IA4 can be, but is not limited to, a right (or left) edge area of the substrate SUB.

A plurality of pixels P can be provided on the display area AA of the substrate SUB. The pixels P according to one example can be a plurality of pixels arranged in a matrix arrangement, and can be arranged in the display area AA of the substrate SUB. The pixels P can be defined by scan lines SL, data lines DL, and pixel driving power lines PL.

The scan line SL is laterally extended along a first direction X and arranged along a second direction Y crossing the first direction X at a certain interval. The display area AA of the substrate SUB includes a plurality of scan lines SL spaced apart from one another along the second direction Y in parallel with the first direction X. In this case, the first direction X can be defined as a horizontal direction of the substrate SUB and the second direction Y can be defined as a vertical direction of the substrate SUB, or vice versa without limitation to this case.

The data line DL is longitudinally extended along the second direction Y and arranged along the first direction X at a certain interval. The display area AA of the substrate SUB includes a plurality of data lines DL spaced apart from one another along the first direction X in parallel with the second direction Y.

The pixel driving power line PL can be arranged on the substrate SUB to be parallel with the data line DL. The display area AA of the substrate SUB includes a plurality of pixel driving power lines PL parallel with the data lines DL. Optionally, the pixel driving power lines PL can be arranged to be parallel with the scan lines SL.

The pixels P according to one example can be arranged on the display area AA to have a stripe structure. In this case, one-unit pixel can include a red subpixel, a green subpixel, and a blue subpixel. Moreover, one-unit pixel can further include a white subpixel.

The pixels P according to another example can be arranged on the display area AA to have a pentile structure. In this case, one-unit pixel can include at least one red subpixel, at least two green subpixels, and at least one blue pixel, which are arranged in a polygonal shape two-dimensionally. For example, one-unit pixel having a pentile structure can be arranged such that one red subpixel, two green subpixels and one blue subpixel have an octagonal shape two-dimensionally. In this case, the blue subpixel can have an opening area (or light emitting area) which is relatively the greatest, and the green subpixel can have an opening area which is relatively the smallest.

The pixel P can include a pixel circuit PC electrically connected with its adjacent scan line SL, a data line DL and a driving power line PL, and a light emitting diode ED electrically connected with the pixel circuit PC.

The pixel circuit PC controls a current Ied flowing from the pixel driving power line PL to the light emitting diode ED based on a data voltage supplied from its adjacent data line DL in response to a scan signal supplied from at least one scan line SL adjacent thereto.

The pixel circuit PC according to one example can include at least two thin film transistors and one capacitor. For example, the pixel circuit PC according to one example can include a driving thin film transistor supplying the data current Ied based on the data voltage to the light emitting diode ED, a switching thin film transistor supplying the data voltage supplied from the data line DL to the driving thin film transistor, and a capacitor storing a gate-source voltage of the driving thin film transistor.

The pixel circuit PC according to another example can include at least three thin film transistors and at least one capacitor. For example, the pixel circuit PC according to another example can include a current supply circuit, a data supply circuit and a compensation circuit in accordance with an operation (or function) of each of at least three thin film transistors. In this case, the current supply circuit can include a driving thin film transistor supplying the data current Ied based on the data voltage to the light emitting diode ED. The data supply circuit can include at least one switching thin film transistor supplying the data voltage supplied from the data line DL to the current supply circuit in response to at least one scan signal. The compensation circuit can include at least one compensation thin film transistor compensating for a change of a characteristic value (threshold voltage and/or mobility) of the driving thin film transistor in response to at least one scan signal.

The light emitting diode ED emits the light of luminance corresponding to the data current Ied supplied from the pixel circuit PC. In this case, the data current Ied can flow from the driving power line PL to the common power line CPL through the driving thin film transistor and the light emitting diode ED.

The light emitting diode ED according to one example can include a pixel driving electrode (not shown) (or first electrode or anode) electrically connected with the pixel circuit PC, a light emitting layer (not shown) formed on the pixel driving electrode, and a common electrode CE (or second electrode or cathode) electrically connected with the light emitting layer.

The common power line CPL is arranged on the non-display area IA of the substrate SUB and electrically connected with the common electrode CE arranged on the display area AA. The common power line CPL according to one example is arranged along the second to fourth non-display areas IA2, IA3 and IA4 adjacent to the display area AA of the substrate SUB while having a certain line width, and surrounds the other portion except a portion of the display area AA adjacent to the first non-display area IA1 of the substrate SUB. One end of the common power line CPL can be arranged on one side of the first non-display area IA1, and the other end of the common power line CPL can be arranged on the other side of the first non-display area IA1. One end and the other end of the common power line CPL can be arranged to surround the second to fourth non-display areas IA2, IA3 and IA4. Therefore, the common power line CPL according to one example can two-dimensionally have a '∩' shape of which one side corresponding to the first non-display area IA1 of the substrate SUB is opened.

An encapsulation layer can be formed on the substrate SUB to surround an upper surface and a side of the display area AA and the common power line CPL. Meanwhile, the encapsulation layer can expose one end and the other end of the common power line CPL in the first non-display area IA1. The encapsulation layer can prevent oxygen or water from permeating into the light emitting diode ED provided in the display area AA. The encapsulation layer according to one example can include at least one inorganic film. The encapsulation layer according to another example can include a plurality of inorganic films and organic films interposed among the plurality of inorganic films.

The electroluminescence display device according to one embodiment of the present disclosure may include a pad portion PP, a gate driving circuit 200, and a driving integrated circuit 300.

The pad portion PP can include a plurality of pads provided in the non-display area IA of the substrate SUB. The pad portion according to one example can include a plurality of common power supply pads, a plurality of data input pads, a plurality of power supply pads and a plurality of control signal input pads, which are provided in the first non-display area IA1 of the substrate SUB.

The gate driving circuit 200 is provided in the third non-display area IA3 and/or the fourth non-display area IA4 of the substrate SUB and connected with the scan lines SL provided in the display area AA in a one-to-one relationship. The gate driving circuit 200 can be integrated with the third non-display area IA3 and/or the fourth non-display area IA4 of the substrate SUB together with a manufacturing process of the pixel P, that is, a manufacturing process of the thin film transistor. The gate driving circuit 200 generates a scan signal based on a gate control signal supplied from the driving integrated circuit 300 and outputs the scan signal in accordance with a given order, thereby driving each of the plurality of scan lines SL in accordance with the given order. The gate driving circuit 200 according to one example can include a shift register.

The dam DM can have a closed curve structure in which it is provided in the first non-display area IA1, the second non-display area IA2, the third non-display area IA3 and the fourth non-display area IA4 of the substrate SUB to surround the periphery of the display area AA. For example, the dam DM can be arranged outside the common power line CPL and therefore located at the outermost above the substrate SUB. Preferably, the pad portion PP and the driving integrated circuit 300 are arranged in an outer area of the dam DM.

Although FIG. 1 shows that the dam DM is arranged at the outermost, the dam DM is not limited to the example of FIG. 1. As another example, the dam DM may be arranged between the common power line CPL and the gate driving circuit 200. As other example, the dam DM may be arranged between the display area AA and the gate driving circuit 200. The dam DM may have a closed curve shape that completely surrounds the display area AA from the outside of the display area AA.

The driving integrated circuit 300 is packaged in a chip packaging area defined in the first non-display area IA1 of the substrate SUB through a chip packaging (bonding) process. Input terminals of the driving integrated circuit 300 are electrically connected with the pad portion PP and therefore electrically connected with the plurality of data lines DL and the plurality of pixel driving power lines PL, which are provided in the display area AA. The driving integrated circuit 300 receives various power sources, timing synchronizing signals and digital image data, which are input from a display driving circuit portion (or host circuit) through the pad portion PP, controls driving of the gate driving circuit 200 by generating a gate control signal in accordance with the timing synchronizing signals and at the same time converts the digital image data to an analog type pixel data voltage to supply the converted data voltage to the corresponding data line DL.

First Embodiment

Figure 2:
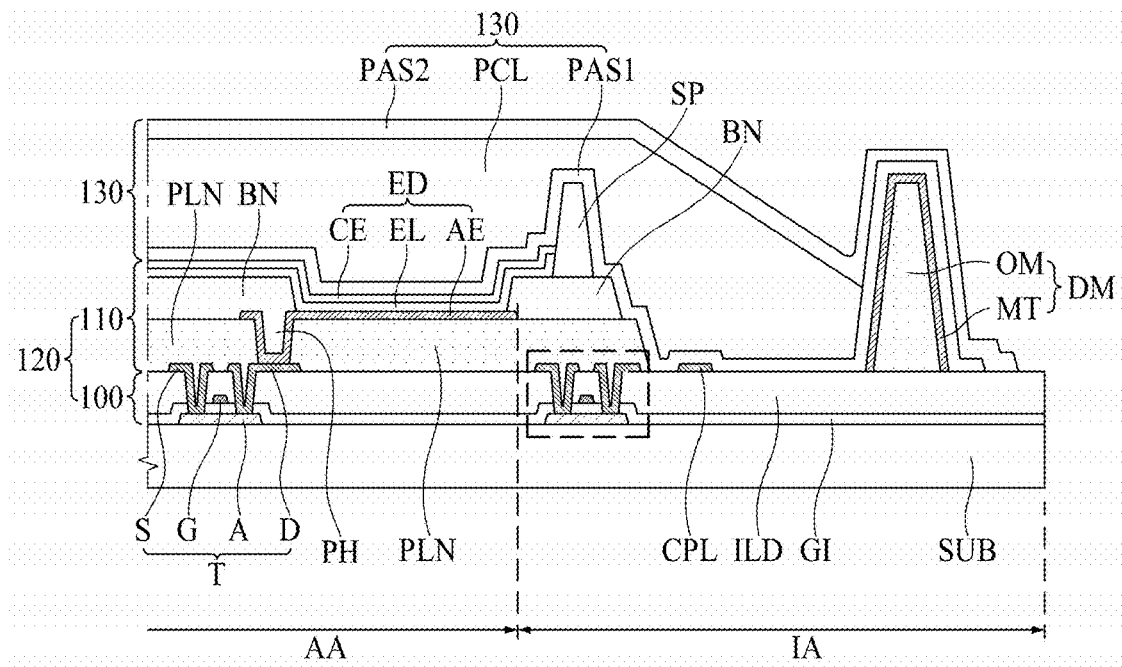
FIG. 2 is a cross-sectional view, along the cutting line I-I' in FIG. 1, illustrating a structure of an electroluminescence display device according to the first embodiment of the present disclosure.

Referring to FIG. 2, an electroluminescence display device according to the first embodiment of the present disclosure will be explained. FIG. 2 is a cross-sectional view, along the cutting line I-I' in FIG. 1, illustrating a structure of an electroluminescence display device according to the first embodiment of the present disclosure.

The electroluminescence display device according to the first embodiment of the present disclosure may include a substrate SUB, a pixel array layer 120, a spacer SP and an encapsulation layer 130.

The substrate SUB is a base layer, and includes a plastic material or a glass material. The substrate SUB according to one example may have an opaque or colored polyimide material. The electroluminescence display devices according to another example may include a back plate attached at the rear surface of the substrate SUB. The back plate may be an element for maintaining the substrate SUB in a plane state. The back plate may be made of plastic materials such as a polyethylene terephthalate material.

The substrate SUB according to another embodiment of the present disclosure may be a flexible glass substrate. For example, the flexible substrate SUB of a glass material may be a thin type glass substrate having a thickness of 100 micrometers or less or a glass substrate etched by a substrate etching process to have a thickness of 100 micrometers or less.

The substrate SUB may include a display area AA and a non-display area IA surrounding the display area AA. The non-display area IA shown in FIG. 2, may be corresponding to the fourth non-display area IA4 shown in FIG. 1.

A buffer film (not shown) may be formed on an upper surface of the substrate SUB. The buffer film is formed on one surface of the substrate SUB to shield water from permeating into the pixel array layer 120 through the substrate SUB vulnerable to water permeation. The buffer film according to one example may be made of a plurality of inorganic films deposited alternately. For example, the buffer film may be formed of a multi-layered film of one or more inorganic films of a silicon oxide film (SiOx), a silicon nitride film (SiNx) and SiON, which are deposited alternately. In the figures, the buffer film is omitted, in convenience.

The pixel array layer 120 may include a driving layer 100 and an emission layer 110. The driving layer 100 may have a plurality of thin film transistors T, and the emission layer 110 may have a plurality of light emitting diodes ED. The pixel array layer 120 may include a thin film transistor layer, a planarization layer PLN, a bank pattern BN, and a light emitting diode ED.

The driving layer 100 according to one example may include a thin film transistor T, a gate insulating film GI, an intermediate insulating layer ILD. In this case, the thin film transistor T shown in FIG. 2 may be a driving thin film transistor electrically connected with the light emitting diode ED.

The thin film transistor T includes a semiconductor A, a gate electrode G, a source electrode S and a drain electrode D, which are formed on the substrate SUB or the buffer film. FIG. 2 show, but is not limited to, a top gate structure of the thin film transistor T, in which the gate electrode G is arranged above the semiconductor layer A. For another example, the thin film transistor T may have a bottom gate structure in which the gate electrode G is arranged below the semiconductor layer A, or a double gate structure in which the gate electrode G is arranged above and below the semiconductor layer A.

The semiconductor layer A may be formed on the substrate SUB or the buffer film. The semiconductor layer A may include a silicon-based semiconductor material, an oxide-based semiconductor material, or an organic based semiconductor material, and may have a single layered structure or a multi-layered structure. A light shielding layer for shielding external light entering the semiconductor layer A may additionally be formed between the buffer film and the semiconductor layer A.

The gate insulating film GI may be formed on the entire substrate SUB to cover the semiconductor layer A. The gate insulating film GI can be formed of an inorganic film, for example, a silicon oxide (SiOx) film, a silicon nitride (SiNx) film, or a multi-layered film of SiOx and SiNx.

The gate electrode G may be formed on the gate insulating film GI to overlap the semiconductor layer A. The gate electrode G may be formed together with the scan line SL. The gate electrode G according to one example may be formed of a single layer or multi-layer of any one of Mo, Al, Cr, Au, Ti, Ni, Nd, and Cu, or their alloy.

The intermediate insulating layer ILD may be formed on the entire substrate SUB to cover the gate electrode G and the gate insulating film GI. The intermediate insulating layer ILD provides a planarization plane on the gate electrode G and the gate insulating film GI.

The source electrode S and the drain electrode D may be formed on the intermediate insulating layer ILD to overlap the semiconductor layer A. The gate electrode G is interposed between the source electrode S and the drain electrode D. The source electrode S and the drain electrode D may be formed together with the data line DL, the driving power line PL and the common power line CPL. For instance, the source electrode S, the drain electrode D, the data line DL, the driving power line PL and the common power line CPL are respectively formed by a patterning process for a source-drain electrode material at the same time.

Each of the source electrode S and the drain electrode D may be connected to the semiconductor layer A through an electrode contact hole that passes through the intermediate insulating layer ILD and the gate insulating film GI. The source electrode S and the drain electrode D may be formed of a single layer or multi-layer of any one of Mo, Al, Cr, Au, Ti, Ni, Nd, and Cu, or their alloy. In this case, the source electrode S of the thin film transistor T shown in FIG. 2 may electrically be connected with the pixel driving power line PL.

As described above, the thin film transistor T provided in the pixel P of the substrate SUB constitutes a pixel circuit PC. Also, the gate driving circuit 200, as shown in FIG. 1, arranged in the fourth non-display area IA4 of the substrate SUB may include a thin film transistor the same as or similar to the thin film transistor T (as shown in FIG. 2) provided in the pixel P.

The planarization layer PLN is formed on the entire substrate SUB to cover the driving layer 100. The planarization layer PLN provides a planarization surface on the driving layer 100. The planarization layer PLN according to one example may be formed of an organic film or an inorganic film. For the case of inorganic film, the planarization layer PLN may include a silicon oxide (SiOx), a silicon nitride (SiNx) or multiple layer thereof. For the case of organic film, the planaraization layer PLN may include acrylic resin, epoxy resin, phenolic resin, polyamide resin, or polyimide resin. For another case, the planarization layer PLN may have a structure in which the organic films and the inorganic films are alternately stacked. The planarization layer PLN according to another example can include a pixel contact hole PH for exposing the drain electrode D of the driving thin film transistor provided in the pixel P.

The bank pattern BN is arranged on the planarization layer PLN and defines an opening area (or light emitting area) inside the pixel P of the display area AA. The bank pattern BN may be expressed as a pixel defining film.

The light emitting diode ED may include a pixel driving electrode AE, a light emitting layer EL, and a common electrode CE. The pixel driving electrode AE is formed on the planarization layer PLN and electrically connected to the drain electrode D of the driving thin film transistor through the pixel contact hole PH provided in the planarization layer PLN. In this case, the other edge portion except a center portion of the pixel driving electrode AE overlapped with the opening area of the pixel P may be covered by the bank pattern BN. The bank pattern BN may define an opening area of the pixel P by covering the edge portion of the pixel driving electrode AE.

The pixel driving electrode AE according to one example can include a metal material of high reflectivity. For example, the pixel driving electrode AE can be formed of a multi-layered structure such as a deposited structure (Ti/Al/Ti) of aluminum (Al) and titanium (Ti), a deposited structure (ITO/Al/ITO) of Al and ITO, an APC (Ag/Pd/Cu) alloy, and a deposited structure (ITO/APC/ITO) of APC alloy and ITO, or can include a single layered structure made of a material of any one or an alloy material of two or more selected from Ag, Al, Mo, Au, Mg, Ca and Ba.

The light emitting layer EL is entirely formed on the display area AA of the substrate SUB to cover the pixel driving electrode AE and the bank pattern BN. The light emitting layer EL according to one example can include two or more light emitting portions vertically deposited to emit a white light. For example, the light emitting layer EL according to one example can include first and second light emitting portions for emitting a white light by combination of a first light and a second light.

The light emitting layer EL according to another example may include any one of a blue light emitting portion, a green light emitting portion and a red light emitting portion to emit a color light corresponding to a color set in the pixel P. For example, the light emitting layer EL may include any one of an organic light emitting layer, an inorganic light emitting layer and a quantum-dot light emitting layer, or may include a deposited or combination structure of the organic light emitting layer (or the inorganic light emitting layer) and the quantum-dot light emitting layer.

Additionally, the light emitting diode ED according to one example may further include a functional layer for improving light emission efficiency and/or lifetime of the light emitting layer EL.

The common electrode CE is formed to be electrically connected with the light emitting layer EL. The common electrode CE is formed on the entire display area AA of the substrate SUB and therefore commonly connected with the light emitting layers EL provided in each pixel P.

The common electrode CE according to one example may include a transparent conductive material or a semi-transmissive conductive material, which may transmit light. When the common electrode CE is formed of a semi-transmissive conductive material, light emission efficiency of light emitted from the light emitting diode ED may be enhanced through a micro cavity structure. The semi-transmissive conductive material according to one example may include Mg, Ag, or an alloy of Mg and Ag. Additionally, a capping layer for improving emission efficiency of light by controlling a refractive index of light emitted from the light emitting diode ED may further be formed on the common electrode CE.

The spacer SP can be arranged to be distributed in an opening area inside the display area AA, that is, an area where the light emitting diode ED is not arranged. The spacer SP is intended to allow a screen mask and a substrate not to be in contact with each other during a process of depositing the light emitting layer EL. The spacer SP is arranged on the bank pattern BN, and can be deposited to allow the light emitting layer EL and the common electrode CE to overstride/cover the spacer SP arranged inside the display area AA.

As the case can be, the light emitting layer EL and/or the common electrode CE may not overstride the spacer SP. Since the spacer SP is arranged in only a portion of the bank pattern BN inside the display area AA, the common electrode CE has a structure connected with the display area AA while fully covering the display area AA even though the common electrode CE does not overstride the spacer SP.

The encapsulation layer 130 is formed to surround an upper surface and a side of the emission layer 110. The encapsulation layer 130 serves to prevent oxygen or water from permeating into the light emitting diode ED.

The encapsulation layer 130 according to one example may include a first inorganic encapsulation layer PAS1, an organic encapsulation layer PCL on the first inorganic encapsulation layer PAS1, and a second inorganic encapsulation layer PAS2 on the organic encapsulation layer PCL. The first inorganic encapsulation layer PAS1 and the second inorganic encapsulation layer PAS2 serve to shield water or oxygen from permeating into the light emitting diode ED. Each of the first inorganic encapsulation layer PAS1 and the second inorganic encapsulation layer PAS2 may be formed of an inorganic material such as a silicon nitride, an aluminum nitride, a zirconium nitride, a titanium nitride, a hafnium nitride, a tantalum nitride, a silicon oxide, an aluminum oxide, or a titanium oxide. The first inorganic encapsulation layer PAS1 and the second inorganic encapsulation layer PAS2 may be formed by a Chemical Vapor Deposition (CVD) process or an Atomic Layer Deposition (ALD) process.

The organic encapsulation layer PCL is surrounded by the first inorganic encapsulation layer PAS1 and the second inorganic encapsulation layer PAS2. The organic encapsulation layer PCL may be formed to be relatively thicker than the first inorganic encapsulation layer PAS1 and/or the second inorganic encapsulation layer PAS2 to adsorb and/or shield particles that may occur during a manufacturing process. The organic encapsulation layer PCL may be made of an organic material such as SiOCx (silicon oxy-carbon) acryl or epoxy resin. The organic encapsulation layer PCL may be formed by a coating process, for example, an ink-jet coating process or a slit coating process.

The electroluminescence display device according to the first embodiment of the present disclosure may further include a dam (or dam structure) DM. The dam DM is arranged in the non-display area IA of the substrate SUB to prevent the organic encapsulation layer PCL from overflowing. Additionally, the dam DM may prevent the penetration of hydrogen gas or hydrogen particles that may intrude from the lower surface side of the encapsulation layer 130.

The dam DM according to one example may be arranged outside the display area AA, the gate driving circuit 200 which is arranged outside the display area AA, and the common power line CPL arranged outside the gate driving circuit 200. As the case may be, the dam DM may be arranged to overlap an outer side of the common power line CPL. In this case, a width of the non-display area IA where the gate driving circuit 200 and the common power line CPL are arranged may be reduced to reduce a bezel width.

The dam DM may include an organic layer OM and a hydrogen absorbing layer MT. For example, the organic layer OM may be formed on the intermediate insulating layer ILD of the driving layer 100. For another example, before depositing the planarization layer PLN on the driving layer 100, a buffer layer may be further deposited. In this case, the organic layer OM may be formed on the buffer layer. Here, the organic layer OM may be made of the same material with the spacer SP formed in the display area AA. Otherwise, the organic layer OM may be made of the same material with the planarization layer PLN and/or the bank BN.

The organic layer OM may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the organic layer OM. The inner wall side may connect the bottom side to the top side, and be facing to the display area AA. The outer wall side may connect the bottom side to the top side, and be arranged facing the outside to be symmetrical with the inner wall side.

The hydrogen absorbing layer MT may be a thin film layer covering the organic layer OM. For example, the hydrogen absorbing layer MT may be stacked while in contact with the organic layer OM so as to cover the inner wall side, the top side and the outer wall side. The hydrogen absorbing layer MT is for preventing penetration of hydrogen particles from the outside, and it is preferable that the hydrogen absorbing layer MT may include a material having excellent properties of absorbing the hydrogen particles. For example, the hydrogen absorbing layer MT may be made of molybdenum (Mo) or titanium (Ti), or an alloy metal of the molybdenum and the titanium.

The dam DM may be covered by the first inorganic encapsulation layer PAS1 and/or second inorganic encapsulation layer PAS2 of the encapsulation layer 130. The organic encapsulation layer PCL may be disposed to a certain height of the inner wall side of the dam DM. For example, the height of the organic encapsulation layer PCL at the outermost area may be lower than the top side of the organic layer OM of the dam DM. As the result, at the top side and the outer wall side of the dam DM, the first inorganic encapsulation layer PAS1 and the second inorganic encapsulation layer PAS2 may be contacted in face each other.

The dam DM according to the first embodiment of the present disclosure may include the hydrogen absorbing layer MT for blocking the hydrogen particles from propagating to the display area AA by absorbing the hydrogen particles which may penetrate from the outside. Therefore, the emission layer EL and/or the semiconductor layer A including oxide semiconductor material, which are disposed on the display area AA, may be protected from the hydrogen particles. Accordingly, the electroluminescence display device according to the first embodiment of the present disclosure may have long life time and high quality for the long-life time.

Second Embodiment

Figure 3:
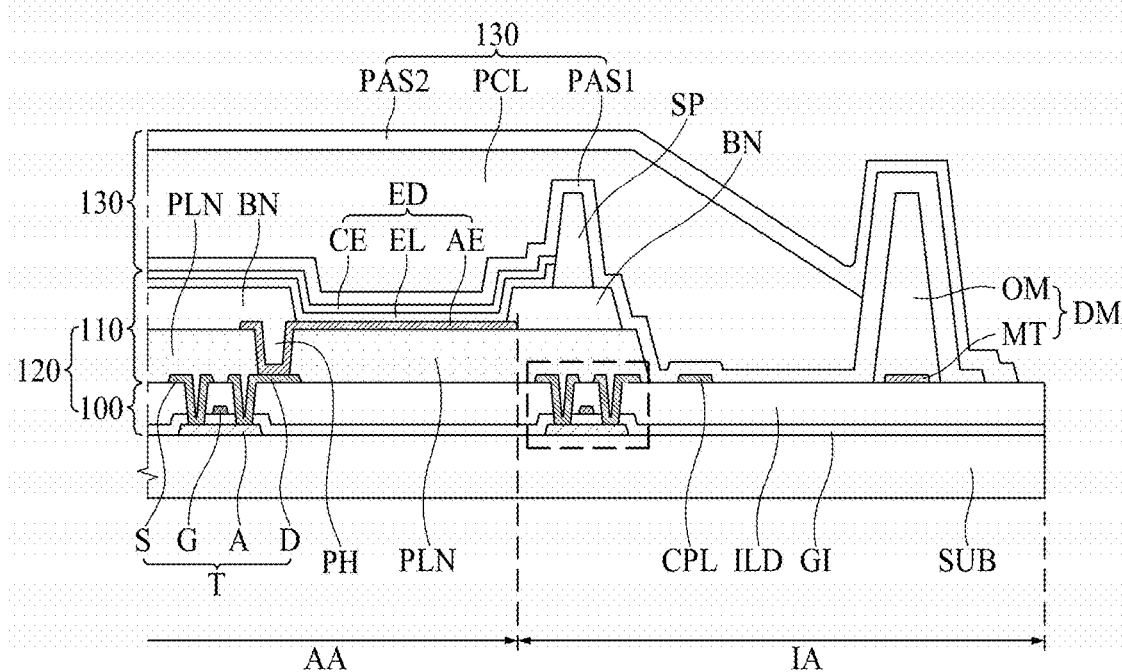
FIG. 3 is a cross-sectional view, along the cutting line I-I' in FIG. 1, illustrating a structure of an electroluminescence display device according to the second embodiment of the present disclosure.

Hereinafter, referring to FIG. 3, an electroluminescence display device according to the second embodiment of the present disclosure will be explained. FIG. 3 is a cross-sectional view, along the cutting line I-I' in FIG. 1, illustrating a structure of an electroluminescence display device according to the second embodiment of the present disclosure.

The electroluminescence display device according to the second embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

Referring to FIG. 3, the dam DM according to the second embodiment of the present disclosure may include an organic layer OM and a hydrogen absorbing layer MT. For an example, the organic layer OM may be made of the same material with the spacer SP formed in the display area AA. For another example, the organic layer OM may be made of the same material with the planarization layer PLN and/or bank BN.

The organic layer OM may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the organic layer OM. The inner wall side may connect the bottom side to the top side, and be facing to the display area AA. The outer wall side may connect the bottom side to the top side, and be arranged facing the outside to be symmetrical with the inner wall side.

The hydrogen absorbing layer MT may be a thin film type layer disposed and/or stacked between the organic layer OM and the driving layer 100. For example, the hydrogen absorbing layer MT may be disposed between the bottom side of the organic layer OM and the upper surface of the driving layer 100, and may be fully covered by the organic layer OM. In other word, the bottom surface of the organic layer OM may be contact with the upper surface of the hydrogen absorbing layer MT and the upper surface of the driving layer 100. The hydrogen absorbing layer MT is for preventing penetration of hydrogen particles from the outside, and it is preferable that the hydrogen absorbing layer MT may include a material having excellent properties of absorbing the hydrogen particles. For example, the hydrogen absorbing layer MT may be made of molybdenum (Mo) or titanium (Ti), or an alloy metal of the molybdenum and the titanium.

The dam DM according to the second embodiment of the present disclosure may include the hydrogen absorbing layer MT disposed under the organic layer OM for blocking the hydrogen particles from propagating to the display area AA by absorbing the hydrogen particles which may penetrate from the outside. Especially, gas-like foreign materials intruding into the display device may mainly penetrate from the side of the interface between the intermediate insulating layer ILD and the organic layer OM. Therefore, disposing the hydrogen absorbing layer MT at the location where the hydrogen particles are easy to penetrate, it is preferable to protect the display elements arranged in the display area AA by effectively absorbing the hydrogen particles penetrate.

Third Embodiment

Figure 4:
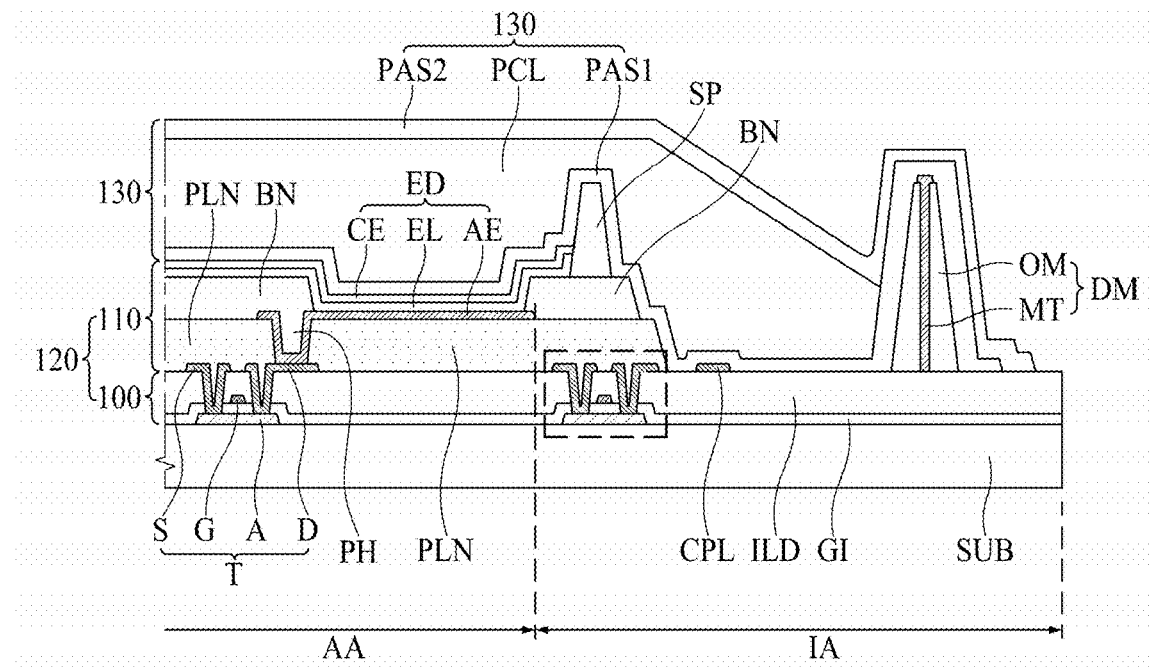
FIG. 4 is a cross-sectional view, along the cutting line I-I' in FIG. 1, illustrating a structure of an electroluminescence display device according to the third embodiment of the present disclosure.

Hereinafter, referring to FIG. 4, an electroluminescence display device according to the third embodiment of the present disclosure will be explained. FIG. 4 is a cross-sectional view, along the cutting line I-I' in FIG. 1, illustrating a structure of an electroluminescence display device according to the third embodiment of the present disclosure.

The electroluminescence display device according to the third embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

Referring to FIG. 4, the dam DM according to the third embodiment of the present disclosure may include an organic layer OM and a hydrogen absorbing layer MT. The organic layer OM may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the organic layer OM. The inner wall side may connect the bottom side to the top side, and be facing to the display area AA. The outer wall side may connect the bottom side to the top side, and be arranged facing the outside to be symmetrical with the inner wall side.

The hydrogen absorbing layer MT may have a shape of vertical wall penetrating the middle portion of the organic layer OM. For an example, the hydrogen absorbing layer MT may be a thin film type wall sheet filling into a vertical through hole from the top side to the bottom side of the organic layer OM. The hydrogen absorbing layer MT is for preventing penetration of hydrogen particles from the outside, and it is preferable that the hydrogen absorbing layer MT may include a material having excellent properties of absorbing the hydrogen particles. For example, the hydrogen absorbing layer MT may be made of molybdenum (Mo) or titanium (Ti), or an alloy metal of the molybdenum and the titanium.

The dam DM according to the third embodiment of the present disclosure may include a hydrogen absorbing layer MT having a vertical wall shape vertically passing through the middle of the organic layer OM.

Fourth Embodiment

Figure 5:
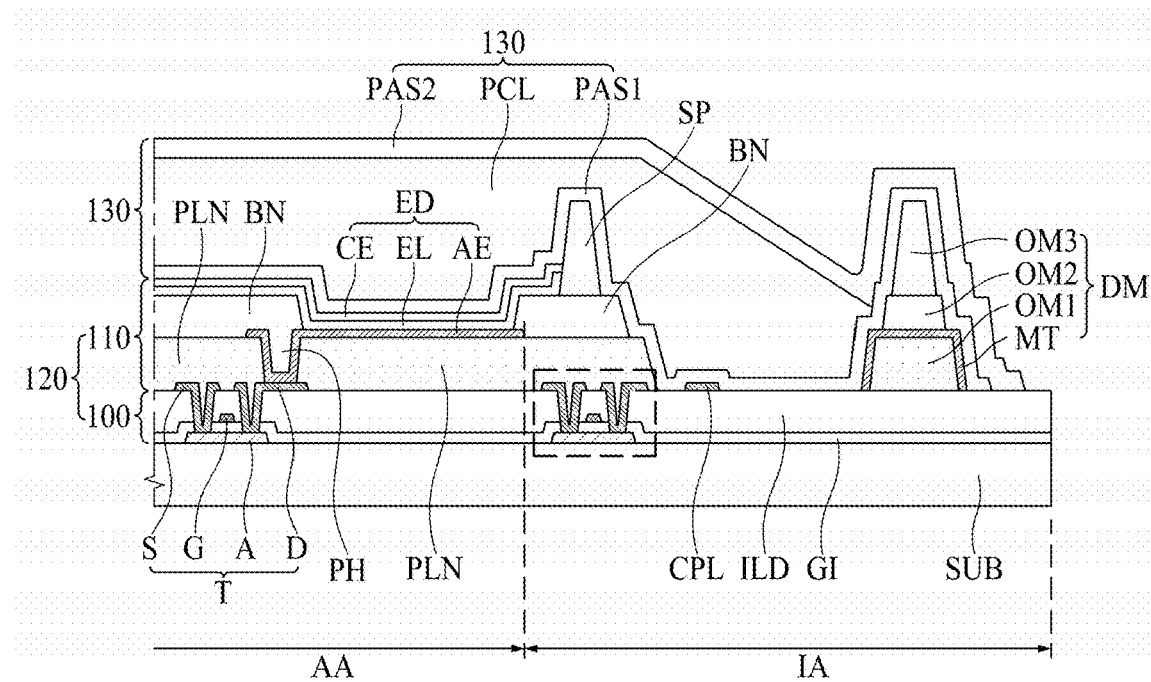
FIG. 5 is a cross-sectional view, along the cutting line I-I' in FIG. 1, illustrating a structure of an electroluminescence display device according to the fourth embodiment of the present disclosure.

Hereinafter, referring to FIG. 5, an electroluminescence display device according to the fourth embodiment of the present disclosure will be explained. FIG. 5 is a cross-sectional view, along the cutting line I-I' in FIG. 1, illustrating a structure of an electroluminescence display device according to the fourth embodiment of the present disclosure.

The electroluminescence display device according to the fourth embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

The dam DM according to the fourth embodiment of the present disclosure may have a multi-layer structure in which a plurality of thin film layers are stacked vertically on the substrate SUB. For example, the dam DM according to the fourth embodiment may include a first organic layer OM1, a second organic layer OM2, a third organic layer OM3 and a hydrogen absorbing layer MT.

The first organic layer OM1 may be made of the same material with the planarization layer PLN at the same time for forming the planarization layer PLN. The first organic layer OM1 may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the first organic layer OM1. The inner wall side may connect the bottom side to the top side, and be facing to the display area AA. The outer wall side may connect the bottom side to the top side, and be arranged facing the outside to be symmetrical with the inner wall side.

The hydrogen absorbing layer MT may be stacked on the first organic layer OM1 as covering the inner wall side, the top side and the outer wall side. The hydrogen absorbing layer MT is for preventing penetration of hydrogen particles from the outside, and it is preferable that the hydrogen absorbing layer MT may include a material having excellent properties of absorbing the hydrogen particles. For example, the hydrogen absorbing layer MT may be made of molybdenum (Mo) or titanium (Ti), or an alloy metal of the molybdenum and the titanium.

The second organic layer OM2 may be made of the same material with the bank pattern BN at the same time for forming the bank pattern BN. The second organic layer OM2 may have a trapezoid shape of which cross-sectional shape includes a bottom side, a top side, an inner wall side and an outer wall side. For example, the bottom side may contact on the upper surface of the hydrogen absorbing layer MT. The top side of the second organic layer OM2 may be parallel with the bottom side of the second organic layer OM2, and be apart from the bottom side with a predetermined height. The distance between the bottom side and the top side may be corresponding to the height of the second organic layer OM2. The inner wall side may connect the bottom side to the top side, and be facing to the display area AA. The outer wall side may connect the bottom side to the top side, and be arranged facing the outside to be symmetrical with the inner wall side.

The third organic layer OM3 may be made of the same material with the spacer SP at the same time for forming the spacer SP. The third organic layer OM3 may have a trapezoid shape of which cross-sectional shape includes a bottom side, a top side, an inner wall side and an outer wall side. For example, the bottom side may contact on the top side of the second organic layer OM2. The top side of the third organic layer OM3 may be parallel with the bottom side of the third organic layer OM3, and be apart from the bottom side with a predetermined height. The distance between the bottom side and the top side may be corresponding to the height of the third organic layer OM3. The inner wall side may connect the bottom side to the top side, and be facing to the display area AA. The outer wall side may connect the bottom side to the top side, and be arranged facing the outside to be symmetrical with the inner wall side.

The first organic layer OM1, the second organic layer OM2 and the third organic layer OM3 forming the dam DM according to the fourth embodiment may have a sequentially small cross-sectional area, so that the cross-sectional area of the organic layer disposed at lower position may be wider than the cross-sectional area of the organic layer disposed at upper position.

All of the dam DM may be covered by the first inorganic encapsulation layer PAS1 and/or the second inorganic encapsulation layer PAS2. For example, the height of the organic encapsulation layer PCL at the outermost area may be higher than the first organic layer OM1 and lower than the height of the second organic layer OM2 of the dam DM. Otherwise, the height of the organic encapsulation layer PCL at the outermost area may be higher than the second organic layer OM2 and lower than the height of the third organic layer OM3 of the dam DM.

When the thickness of the organic encapsulation layer PCL may be relatively thin so that the spreadability of the organic encapsulation layer PCL may be easily controlled, the height of the dam DM may not be so high. In this case, the third organic layer OM3 may be omitted.

Fifth Embodiment

Figure 6:
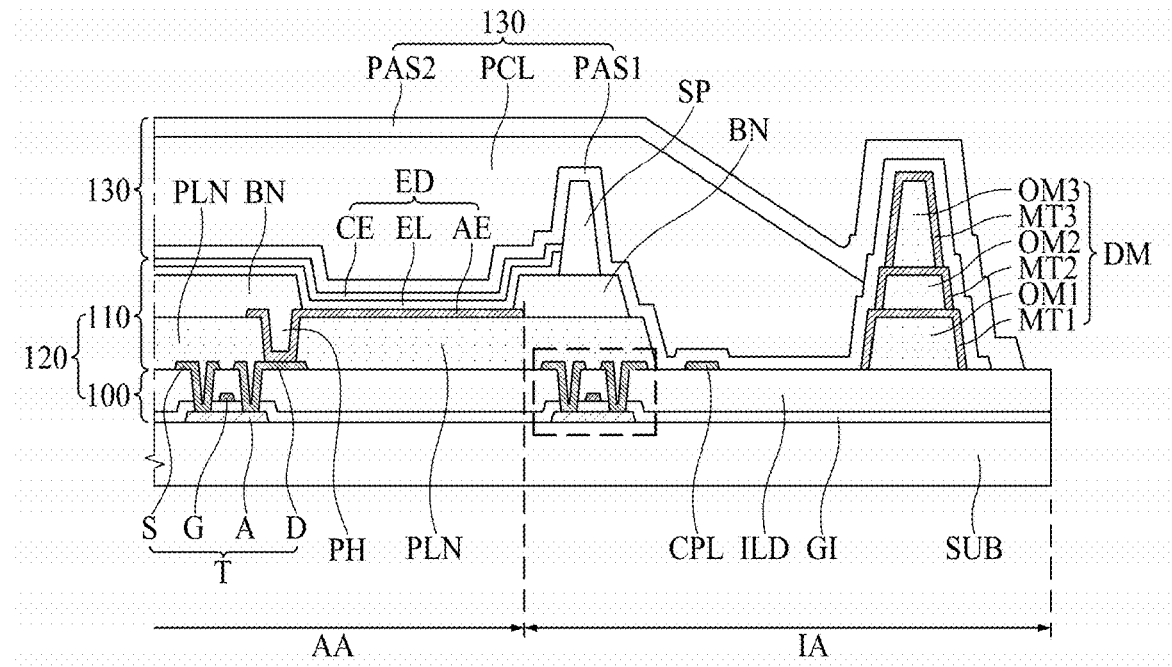
FIG. 6 is a cross-sectional view, along the cutting line I-I' in FIG. 1, illustrating a structure of an electroluminescence display device according to the fifth embodiment of the present disclosure.

Hereinafter, referring to FIG. 6, an electroluminescence display device according to the fifth embodiment of the present disclosure will be explained. FIG. 6 is a cross-sectional view, along the cutting line I-I' in FIG. 1, illustrating a structure of an electroluminescence display device according to the fifth embodiment of the present disclosure.

The electroluminescence display device according to the fifth embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

The dam DM according to the fifth embodiment of the present disclosure may have a multi-layer structure in which a plurality of thin film layers are stacked vertically on the substrate SUB. For example, the dam DM according to the fifth embodiment may include a first organic layer OM1, a second organic layer OM2, a third organic layer OM3, a first hydrogen absorbing layer MT1, a second hydrogen absorbing layer MT2 and a third hydrogen absorbing layer MT3.

The first organic layer OM1 may be made of the same material with the planarization layer PLN at the same time for forming the planarization layer PLN. The first organic layer OM1 may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the first organic layer OM1. The inner wall side may connect the bottom side to the top side, and be facing to the display area AA. The outer wall side may connect the bottom side to the top side, and be arranged facing the outside to be symmetrical with the inner wall side.

The first hydrogen absorbing layer MT1 may be stacked on the first organic layer OM1 as covering the inner wall side, the top side and the outer wall side. The first hydrogen absorbing layer MT1 is for preventing penetration of hydrogen particles from the outside, and it is preferable that the first hydrogen absorbing layer MT1 may include a material having excellent properties of absorbing the hydrogen particles. For example, the first hydrogen absorbing layer MT1 may be made of molybdenum (Mo) or titanium (Ti), or an alloy metal of the molybdenum and the titanium.

The second organic layer OM2 may be made of the same material with the bank pattern BN at the same time for forming the bank pattern BN. The second organic layer OM2 may have a trapezoid shape of which cross-sectional shape includes a bottom side, a top side, an inner wall side and an outer wall side. For example, the bottom side may contact on the upper surface of the first hydrogen absorbing layer MT1. The top side of the second organic layer OM2 may be parallel with the bottom side of the second organic layer OM2, and be apart from the bottom side with a predetermined height. The distance between the bottom side and the top side may be corresponding to the height of the second organic layer OM2. The inner wall side may connect the bottom side to the top side, and be facing to the display area AA. The outer wall side may connect the bottom side to the top side, and be arranged facing the outside to be symmetrical with the inner wall side.

The second hydrogen absorbing layer MT2 may be stacked on the second organic layer OM2 as covering the inner wall side, the top side and the outer wall side of the second organic layer OM2. The second hydrogen absorbing layer MT2 is for preventing penetration of hydrogen particles from the outside, and it is preferable that the second hydrogen absorbing layer MT2 may include a material having excellent properties of absorbing the hydrogen particles. For example, the second hydrogen absorbing layer MT2 may be made of molybdenum (Mo) or titanium (Ti), or an alloy metal of the molybdenum and the titanium.

The third organic layer OM3 may be made of the same material with the spacer SP at the same time for forming the spacer SP. The third organic layer OM3 may have a trapezoid shape of which cross-sectional shape includes a bottom side, a top side, an inner wall side and an outer wall side. For example, the bottom side of the third organic layer OM3 may contact on the upper surface of the second hydrogen absorbing layer MT2. The top side of the third organic layer OM3 may be parallel with the bottom side of the third organic layer OM3, and be apart from the bottom side with a predetermined height. The distance between the bottom side and the top side may be corresponding to the height of the third organic layer OM3. The inner wall side may connect the bottom side to the top side, and be facing to the display area AA. The outer wall side may connect the bottom side to the top side, and be arranged facing the outside to be symmetrical with the inner wall side.

The third hydrogen absorbing layer MT3 may be stacked on the third organic layer OM3 as covering the inner wall side, the top side and the outer wall side of the third organic layer OM3. The third hydrogen absorbing layer MT3 is for preventing penetration of hydrogen particles from the outside, and it is preferable that the third hydrogen absorbing layer MT3 may include a material having excellent properties of absorbing the hydrogen particles. For example, the third hydrogen absorbing layer MT3 may be made of molybdenum (Mo) or titanium (Ti), or an alloy metal of the molybdenum and the titanium.

For another example, any one of the second hydrogen absorbing layer MT2 and the third hydrogen absorbing layer MT3 may be omitted. In these cases, the second organic layer OM2 and the third organic layer OM3 may be included in the dam DM.

Sixth Embodiment

Figure 7:
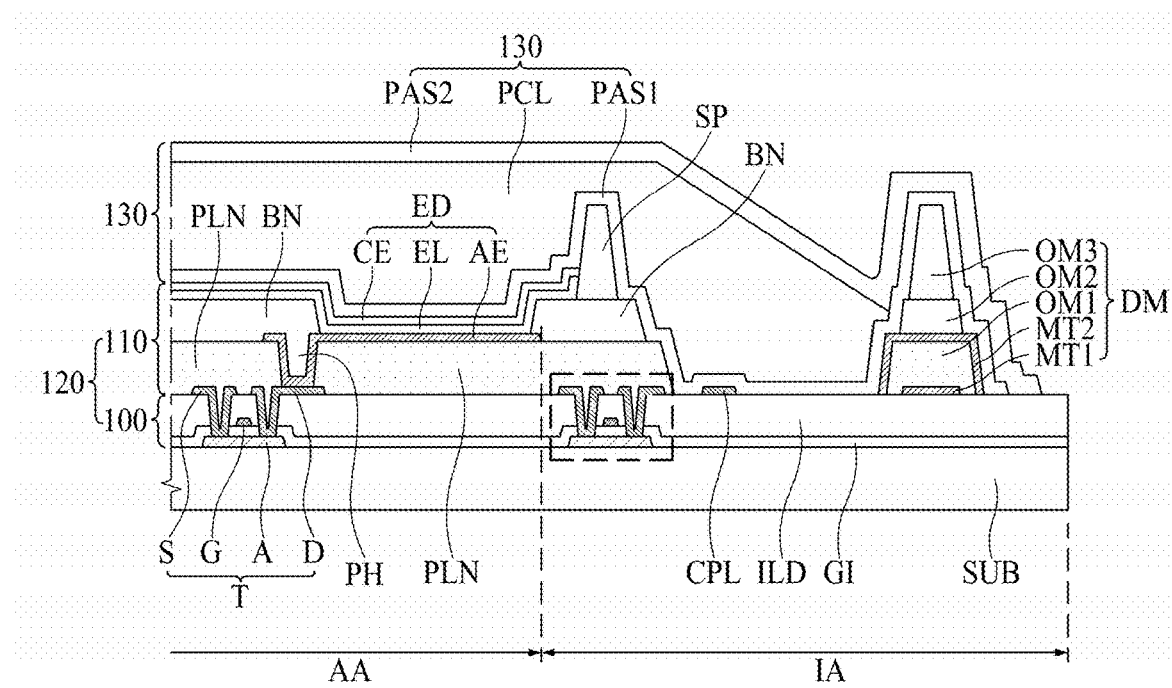
FIG. 7 is a cross-sectional view, along the cutting line I-I' in FIG. 1, illustrating a structure of an electroluminescence display device according to the sixth embodiment of the present disclosure.

Hereinafter, referring to FIG. 7, an electroluminescence display device according to the sixth embodiment of the present disclosure will be explained. FIG. 7 is a cross-sectional view, along the cutting line I-I' in FIG. 1, illustrating a structure of an electroluminescence display device according to the sixth embodiment of the present disclosure.

The electroluminescence display device according to the sixth embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

The dam DM according to the sixth embodiment may include a first organic layer OM1, a second organic layer OM2, a third organic layer OM3, a first hydrogen absorbing layer MT1 and a second hydrogen absorbing layer MT2.

The first organic layer OM1 may be made of the same material with the planarization layer PLN at the same time for forming the planarization layer PLN. The first organic layer OM1 may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the first organic layer OM1. The inner wall side may connect the bottom side to the top side, and be facing to the display area AA. The outer wall side may connect the bottom side to the top side, and be arranged facing the outside to be symmetrical with the inner wall side.

The first hydrogen absorbing layer MT1 may be a thin film stacked between the first organic layer OM1 and the driving layer 100. For example, the first hydrogen absorbing layer MT1 may be disposed between the bottom surface of the first organic layer OM1 and the upper surface of the driving layer 100, and be covered by the first organic layer OM1, totally. In other word, the bottom surface of the first organic layer OM1 may be contact with the upper surface of the first hydrogen absorbing layer MT1 and the upper surface of the driving layer 100.

The second hydrogen absorbing layer MT2 may be stacked on the first organic layer OM1 as covering the inner wall side, the top side and the outer wall side of the first organic layer OM1. The first hydrogen absorbing layer MT1 and the second hydrogen absorbing layer MT2 are for preventing penetration of hydrogen particles from the outside, and it is preferable that the first hydrogen absorbing layer MT1 and the second hydrogen absorbing layer MT2 may include the materials having excellent properties of absorbing the hydrogen particles. For example, the first hydrogen absorbing layer MT1 and the second hydrogen absorbing layer MT2 may be made of molybdenum (Mo) or titanium (Ti), or an alloy metal of the molybdenum and the titanium.

The second organic layer OM2 may be made of the same material with the bank pattern BN at the same time for forming the bank pattern BN. The second organic layer OM2 may have a trapezoid shape of which cross-sectional shape includes a bottom side, a top side, an inner wall side and an outer wall side. For example, the bottom side of the second organic layer OM2 may contact on the upper surface of the second hydrogen absorbing layer MT2. The top side of the second organic layer OM2 may be parallel with the bottom side of the second organic layer OM2, and be apart from the bottom side with a predetermined height. The distance between the bottom side and the top side may be corresponding to the height of the second organic layer OM2. The inner wall side may connect the bottom side to the top side, and be facing to the display area AA. The outer wall side may connect the bottom side to the top side, and be arranged facing the outside to be symmetrical with the inner wall side.

The third organic layer OM3 may be made of the same material with the spacer SP at the same time for forming the spacer SP. The third organic layer OM3 may have a trapezoid shape of which cross-sectional shape includes a bottom side, a top side, an inner wall side and an outer wall side. For example, the bottom side of the third organic layer OM3 may contact on the top side of the second organic layer OM2. The top side of the third organic layer OM3 may be parallel with the bottom side of the third organic layer OM3, and be apart from the bottom side with a predetermined height. The distance between the bottom side and the top side may be corresponding to the height of the third organic layer OM3. The inner wall side may connect the bottom side to the top side, and be facing to the display area AA. The outer wall side may connect the bottom side to the top side, and be arranged facing the outside to be symmetrical with the inner wall side.

Seventh Embodiment

Figure 8:
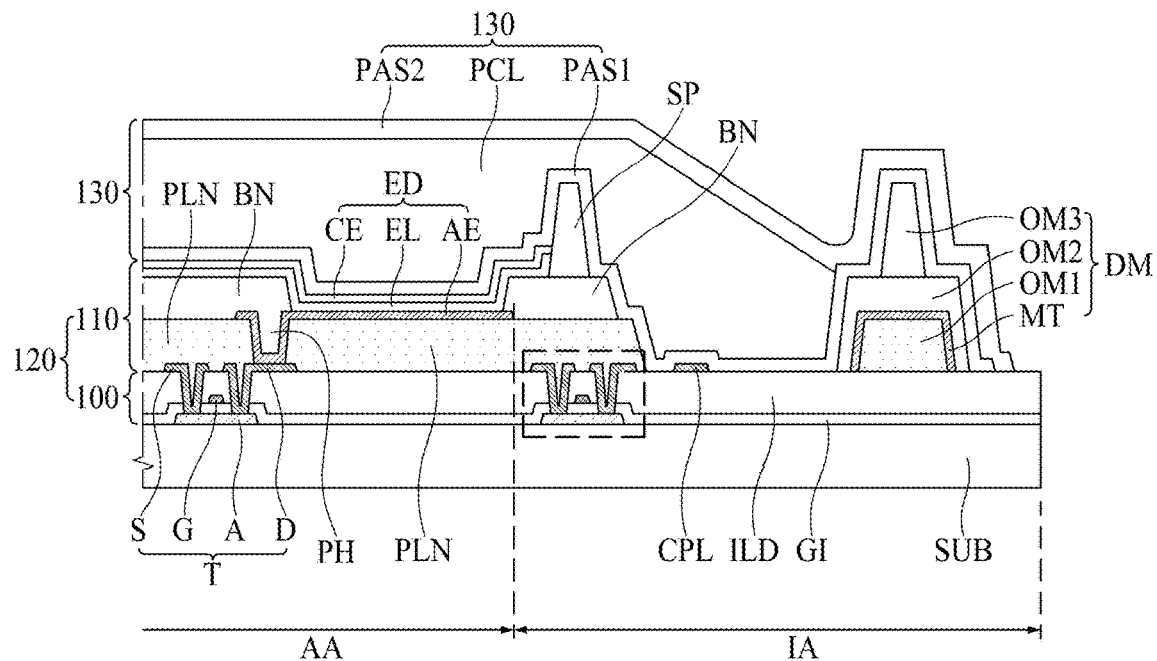
FIG. 8 is a cross-sectional view, along the cutting line I-I' in FIG. 1, illustrating a structure of an electroluminescence display device according to the seventh embodiment of the present disclosure.

Hereinafter, referring to FIG. 8, an electroluminescence display device according to the seventh embodiment of the present disclosure will be explained. FIG. 8 is a cross-sectional view, along the cutting line I-I' in FIG. 1, illustrating a structure of an electroluminescence display device according to the seventh embodiment of the present disclosure.

The electroluminescence display device according to the seventh embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

The dam DM according to the seventh embodiment of the present disclosure may have a multi-layer structure in which a plurality of thin film layers are stacked vertically on the substrate SUB. For example, the dam DM according to the seventh embodiment may include a first organic layer OM1, a second organic layer OM2, a third organic layer OM3 and a hydrogen absorbing layer MT.

The first organic layer OM1 may be made of the same material with the planarization layer PLN at the same time for forming the planarization layer PLN. The first organic layer OM1 may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the first organic layer OM1. The inner wall side may connect the bottom side to the top side, and be facing to the display area AA. The outer wall side may connect the bottom side to the top side, and be arranged facing the outside to be symmetrical with the inner wall side.

The hydrogen absorbing layer MT may be stacked on the first organic layer OM1 as covering the inner wall side, the top side and the outer wall side. The hydrogen absorbing layer MT is for preventing penetration of hydrogen particles from the outside, and it is preferable that the hydrogen absorbing layer MT may include a material having excellent properties of absorbing the hydrogen particles. For example, the hydrogen absorbing layer MT may be made of molybdenum (Mo) or titanium (Ti), or an alloy metal of the molybdenum and the titanium.

The second organic layer OM2 may be made of the same material with the bank pattern BN at the same time for forming the bank pattern BN. The second organic layer OM2 may have a trapezoid shape of which cross-sectional shape includes a bottom side, a top side, an inner wall side and an outer wall side. For example, the second organic layer OM2 may have a shape totally covering the hydrogen absorbing layer MT. The second organic layer OM2 may be stacked on the hydrogen absorbing layer MT as covering the inner wall side, the top side and the outer wall side of the first organic layer OM1, and directly contacting whole outer surface of the hydrogen absorbing layer MT. The bottom side of the second organic layer OM2 may contact on the upper surface of the driving layer 100. The top side of the second organic layer OM2 may be parallel with the bottom side of the second organic layer OM2, and be apart from the bottom side with a predetermined height. The distance between the bottom side and the top side may be corresponding to the height of the second organic layer OM2. The inner wall side may connect the bottom side to the top side, and be facing to the display area AA. The outer wall side may connect the bottom side to the top side, and be arranged facing the outside to be symmetrical with the inner wall side.

The third organic layer OM3 may be made of the same material with the spacer SP at the same time for forming the spacer SP. The third organic layer OM3 may have a trapezoid shape of which cross-sectional shape includes a bottom side, a top side, an inner wall side and an outer wall side. For example, the bottom side may contact on the top side of the second organic layer OM2. The top side of the third organic layer OM3 may be parallel with the bottom side of the third organic layer OM3, and be apart from the bottom side with a predetermined height. The distance between the bottom side and the top side may be corresponding to the height of the third organic layer OM3. The inner wall side may connect the bottom side to the top side, and be facing to the display area AA. The outer wall side may connect the bottom side to the top side, and be arranged facing the outside to be symmetrical with the inner wall side.

Eighth Embodiment

Figure 9:
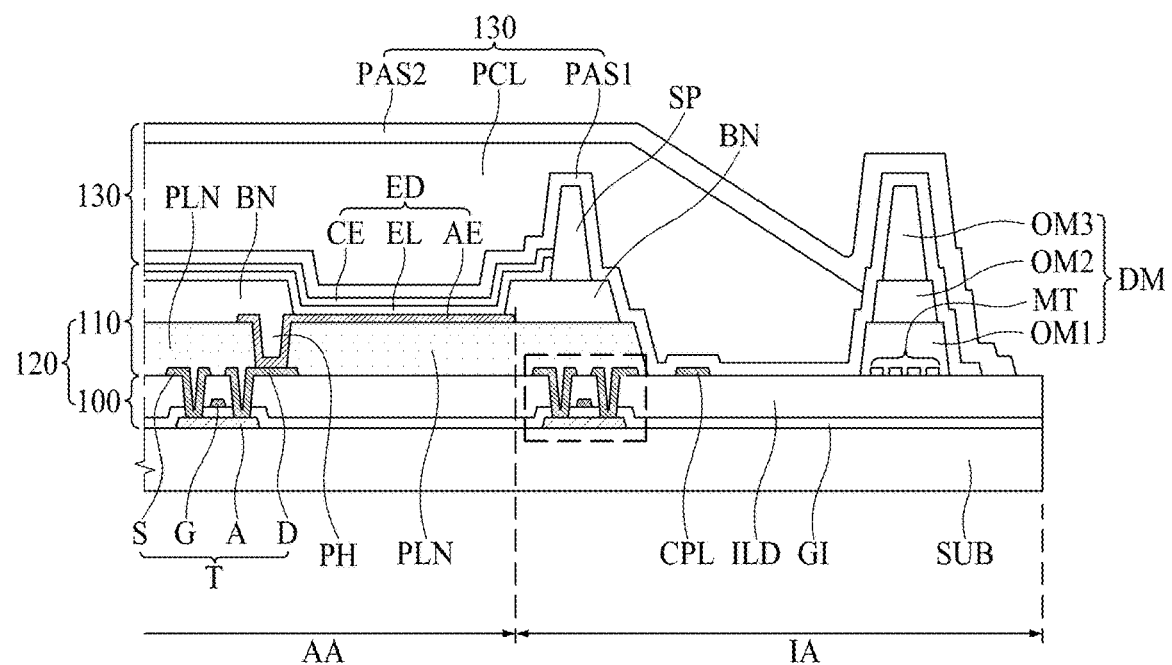
FIG. 9 is a cross-sectional view, along the cutting line I-I' in FIG. 1, illustrating a structure of an electroluminescence display device according to the eighth embodiment of the present disclosure.

Hereinafter, referring to FIG. 9, an electroluminescence display device according to the eighth embodiment of the present disclosure will be explained. FIG. 9 is a cross-sectional view, along the cutting line I-I' in FIG. 1, illustrating a structure of an electroluminescence display device according to the eighth embodiment of the present disclosure.

The electroluminescence display device according to the eighth embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

The dam DM according to the eighth embodiment of the present disclosure may have a multi-layer structure in which a plurality of thin film layers are stacked vertically on the substrate SUB. For example, the dam DM according to the eighth embodiment may include a first organic layer OM1, a second organic layer OM2, a third organic layer OM3 and a hydrogen absorbing layer MT.

The first organic layer OM1 may be made of the same material with the planarization layer PLN at the same time for forming the planarization layer PLN. The first organic layer OM1 may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the first organic layer OM1. The inner wall side may connect the bottom side to the top side, and be facing to the display area AA. The outer wall side may connect the bottom side to the top side, and be arranged facing the outside to be symmetrical with the inner wall side.

The hydrogen absorbing layer MT may be a thin film stacked between the first organic layer OM1 and the driving layer 100. In particular, the hydrogen absorbing layer MT may be formed in the structure of a plurality of islands separated from each other. The hydrogen absorbing layer MT may include a plurality of island shapes in the cross-sectional view and plane view. For example, the hydrogen absorbing layer MT may be disposed between the bottom surface of the first organic layer OM1 and the upper surface of the driving layer 100, and be covered by the first organic layer OM1, totally. In other word, the bottom surface of the first organic layer OM1 may be contact with the upper surface of the hydrogen absorbing layer MT and the upper surface of the driving layer 100.

When the hydrogen absorbing layer MT has a plurality of island shapes, the interface formed by contacting between the hydrogen absorbing layer MT and the first organic layer OM1 may be elongated. When the hydrogen particles intrude and propagate along the interface surface between the driving layer 100 and the first organic layer OM1, the propagating path of the hydrogen particles may have a zig-zag (or embossed) shape so the length of the path may be elongated. As the result, the propagation speed of the hydrogen particles may be slowed down. Further, the surface area of the hydrogen absorbing layer MT contacting with the hydrogen particles may be further wider than the case in which the hydrogen absorbing layer MT is made of one body. Therefore, as the hydrogen particles are propagating through the interface between the hydrogen absorbing layer MT and the first organic layer OM1, the amount of the hydrogen particles may be absorbed by the plurality of island shapes of the hydrogen absorbing layer MT gradually and then the total of the hydrogen particles may be totally eliminated.

The hydrogen absorbing layer MT is for preventing penetration of hydrogen particles from the outside, and it is preferable that the hydrogen absorbing layer MT may include a material having excellent properties of absorbing the hydrogen particles. For example, the hydrogen absorbing layer MT may be made of molybdenum (Mo) or titanium (Ti), or an alloy metal of the molybdenum and the titanium.

The second organic layer OM2 may be made of the same material with the bank pattern BN at the same time for forming the bank pattern BN. The second organic layer OM2 may have a trapezoid shape of which cross-sectional shape includes a bottom side, a top side, an inner wall side and an outer wall side. For example, the bottom side of the second organic layer OM2 may contact on the top side of the first organic layer OM1. The top side of the second organic layer OM2 may be parallel with the bottom side of the second organic layer OM2, and be apart from the bottom side with a predetermined height. The distance between the bottom side and the top side may be corresponding to the height of the second organic layer OM2. The inner wall side may connect the bottom side to the top side, and be facing to the display area AA. The outer wall side may connect the bottom side to the top side, and be arranged facing the outside to be symmetrical with the inner wall side.

The third organic layer OM3 may be made of the same material with the spacer SP at the same time for forming the spacer SP. The third organic layer OM3 may have a trapezoid shape of which cross-sectional shape includes a bottom side, a top side, an inner wall side and an outer wall side. For example, the bottom side may contact on the top side of the second organic layer OM2. The top side of the third organic layer OM3 may be parallel with the bottom side of the third organic layer OM3, and be apart from the bottom side with a predetermined height. The distance between the bottom side and the top side may be corresponding to the height of the third organic layer OM3. The inner wall side may connect the bottom side to the top side, and be facing to the display area AA. The outer wall side may connect the bottom side to the top side, and be arranged facing the outside to be symmetrical with the inner wall side.

The hydrogen absorbing layer MT having a plurality of islands according to the eighth embodiment may be further disposed between the first organic layer OM1 and the second organic layer OM2. For another example, the hydrogen absorbing layer MT having a plurality of islands according to the eighth embodiment may be further disposed between the second organic layer OM2 and the third organic layer OM3. For still another example, the hydrogen absorbing layer MT having a plurality of islands according to the eighth embodiment may be further disposed on the top side of the third organic layer OM3.

Ninth Embodiment

Figure 10:
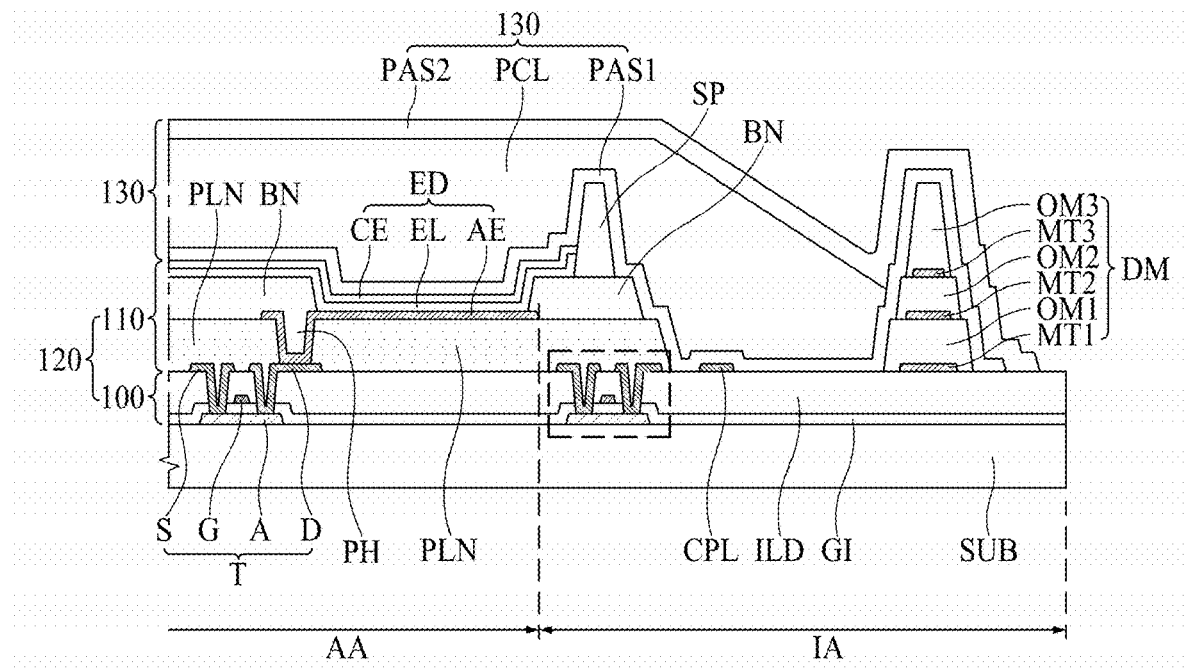
FIG. 10 is a cross-sectional view, along the cutting line I-I' in FIG. 1, illustrating a structure of an electroluminescence display device according to the ninth embodiment of the present disclosure.

Hereinafter, referring to FIG. 10, an electroluminescence display device according to the ninth embodiment of the present disclosure will be explained. FIG. 10 is a cross-sectional view, along the cutting line I-I' in FIG. 1, illustrating a structure of an electroluminescence display device according to the ninth embodiment of the present disclosure.

The electroluminescence display device according to the ninth embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

The dam DM according to the ninth embodiment may include a first organic layer OM1, a second organic layer OM2, a third organic layer OM3, a first hydrogen absorbing layer MT1, a second hydrogen absorbing layer MT2 and a third hydrogen absorbing layer MT3.

The first organic layer OM1 may be made of the same material with the planarization layer PLN at the same time for forming the planarization layer PLN. The first organic layer OM1 may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the first organic layer OM1. The inner wall side may connect the bottom side to the top side, and be facing to the display area AA. The outer wall side may connect the bottom side to the top side, and be arranged facing the outside to be symmetrical with the inner wall side.

The first hydrogen absorbing layer MT1 may be a thin film stacked between the first organic layer OM1 and the driving layer 100. For example, the first hydrogen absorbing layer MT1 may be disposed between the bottom surface of the first organic layer OM1 and the upper surface of the driving layer 100, and be covered by the first organic layer OM1, totally. In other word, the bottom surface of the first organic layer OM1 may be contact with the upper surface of the first hydrogen absorbing layer MT1 and the upper surface of the driving layer 100.

The second organic layer OM2 may be made of the same material with the bank pattern BN at the same time for forming the bank pattern BN. The second organic layer OM2 may have a trapezoid shape of which cross-sectional shape includes a bottom side, a top side, an inner wall side and an outer wall side. For example, the bottom side of the second organic layer OM2 may contact on the top side of the first organic layer OM1. The top side of the second organic layer OM2 may be parallel with the bottom side of the second organic layer OM2, and be apart from the bottom side with a predetermined height. The distance between the bottom side and the top side may be corresponding to the height of the second organic layer OM2. The inner wall side may connect the bottom side to the top side, and be facing to the display area AA. The outer wall side may connect the bottom side to the top side, and be arranged facing the outside to be symmetrical with the inner wall side.

The second hydrogen absorbing layer MT2 may be a thin film stacked between the first organic layer OM1 and the second organic layer OM2. For example, the second hydrogen absorbing layer MT2 may be disposed between the bottom side of the second organic layer OM2 and the top side of the first organic layer OM1, and be covered by the second organic layer OM2, totally.

The third organic layer OM3 may be made of the same material with the spacer SP at the same time for forming the spacer SP. The third organic layer OM3 may have a trapezoid shape of which cross-sectional shape includes a bottom side, a top side, an inner wall side and an outer wall side. For example, the bottom side of the third organic layer OM3 may contact on the top side of the second organic layer OM2. The top side of the third organic layer OM3 may be parallel with the bottom side of the third organic layer OM3, and be apart from the bottom side with a predetermined height. The distance between the bottom side and the top side may be corresponding to the height of the third organic layer OM3. The inner wall side may connect the bottom side to the top side, and be facing to the display area AA. The outer wall side may connect the bottom side to the top side, and be arranged facing the outside to be symmetrical with the inner wall side.

The third hydrogen absorbing layer MT3 may be a thin film stacked between the second organic layer OM2 and the third organic layer OM3. For example, the third hydrogen absorbing layer MT3 may be disposed between the bottom side of the third organic layer OM3 and the top side of the second organic layer OM2, and be covered by the third organic layer OM3, totally.

Alternately, in the ninth embodiment, the hydrogen absorbing layer may include only any selected two of the first hydrogen absorbing layer MT1, the second hydrogen absorbing layer MT2 and the third hydrogen absorbing layer MT3. For example, the hydrogen absorbing layer may include only the first hydrogen absorbing layer MT1 and the third hydrogen absorbing layer MT3. Otherwise, the hydrogen absorbing layer may include only the second hydrogen absorbing layer MT2 and the third hydrogen absorbing layer MT3.

Tenth Embodiment

Figure 11:
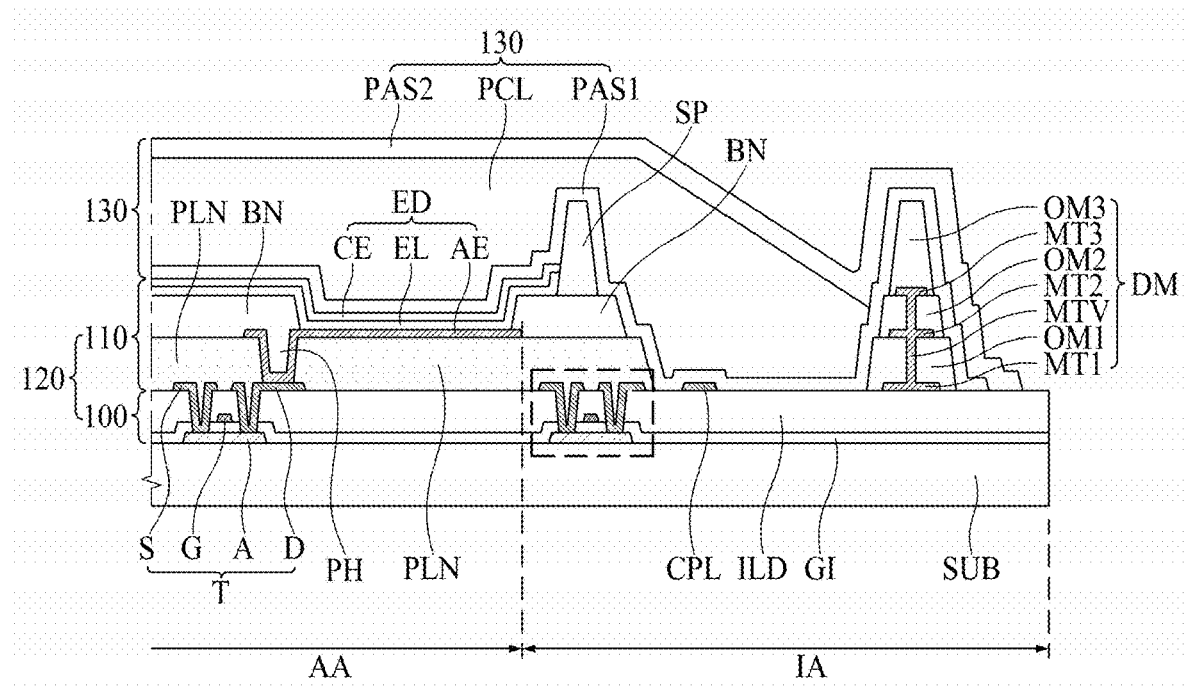
FIG. 11 is a cross-sectional view, along the cutting line I-I' in FIG. 1, illustrating a structure of an electroluminescence display device according to the tenth embodiment of the present disclosure.

Hereinafter, referring to FIG. 11, an electroluminescence display device according to the tenth embodiment of the present disclosure will be explained. FIG. 11 is a cross-sectional view, along the cutting line I-I' in FIG. 1, illustrating a structure of an electroluminescence display device according to the tenth embodiment of the present disclosure.

The electroluminescence display device according to the tenth embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

The dam DM according to the tenth embodiment may include a first organic layer OM1, a second organic layer OM2, a third organic layer OM3, a first hydrogen absorbing layer MT1, a second hydrogen absorbing layer MT2, a third hydrogen absorbing layer MT3 and a vertical hydrogen absorbing layer MTV.

The first organic layer OM1 may be made of the same material with the planarization layer PLN at the same time for forming the planarization layer PLN. The first organic layer OM1 may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the first organic layer OM1. The inner wall side may connect the bottom side to the top side, and be facing to the display area AA. The outer wall side may connect the bottom side to the top side, and be arranged facing the outside to be symmetrical with the inner wall side.

The first hydrogen absorbing layer MT1 may be a thin film stacked between the first organic layer OM1 and the driving layer 100. For example, the first hydrogen absorbing layer MT1 may be disposed between the bottom surface of the first organic layer OM1 and the upper surface of the driving layer 100, and be covered by the first organic layer OM1, totally. In other word, the bottom surface of the first organic layer OM1 may be contact with the upper surface of the first hydrogen absorbing layer MT1 and the upper surface of the driving layer 100.

The second organic layer OM2 may be made of the same material with the bank pattern BN at the same time for forming the bank pattern BN. The second organic layer OM2 may have a trapezoid shape of which cross-sectional shape includes a bottom side, a top side, an inner wall side and an outer wall side. For example, the bottom side of the second organic layer OM2 may contact on the top side of the first organic layer OM1. The top side of the second organic layer OM2 may be parallel with the bottom side of the second organic layer OM2, and be apart from the bottom side with a predetermined height. The distance between the bottom side and the top side may be corresponding to the height of the second organic layer OM2. The inner wall side may connect the bottom side to the top side, and be facing to the display area AA. The outer wall side may connect the bottom side to the top side, and be arranged facing the outside to be symmetrical with the inner wall side.

The second hydrogen absorbing layer MT2 may be a thin film stacked between the first organic layer OM1 and the second organic layer OM2. For example, the second hydrogen absorbing layer MT2 may be disposed between the bottom side of the second organic layer OM2 and the top side of the first organic layer OM1, and be covered by the second organic layer OM2, totally.

The third organic layer OM3 may be made of the same material with the spacer SP at the same time for forming the spacer SP. The third organic layer OM3 may have a trapezoid shape of which cross-sectional shape includes a bottom side, a top side, an inner wall side and an outer wall side. For example, the bottom side of the third organic layer OM3 may contact on the top side of the second organic layer OM2. The top side of the third organic layer OM3 may be parallel with the bottom side of the third organic layer OM3, and be apart from the bottom side with a predetermined height. The distance between the bottom side and the top side may be corresponding to the height of the third organic layer OM3. The inner wall side may connect the bottom side to the top side, and be facing to the display area AA. The outer wall side may connect the bottom side to the top side, and be arranged facing the outside to be symmetrical with the inner wall side.

The third hydrogen absorbing layer MT3 may be a thin film stacked between the second organic layer OM2 and the third organic layer OM3. For example, the third hydrogen absorbing layer MT3 may be disposed between the bottom side of the third organic layer OM3 and the top side of the second organic layer OM2, and be covered by the third organic layer OM3, totally.

The vertical hydrogen absorbing layer MTV may have a vertical wall sheet shape penetrating the middle portions of the first organic layer OM1 and the second organic layer OM2 between the first hydrogen absorbing layer MT1 and the third hydrogen absorbing layer MT3. For example, the vertical hydrogen absorbing layer MTV may be a thin film filling the vertical through-hole penetrating from the top side of the second organic layer OM2 to the bottom side of the first organic layer OM1. The first to third hydrogen absorbing layers MT1, MT2 and MT3 and the vertical hydrogen absorbing layer MTV may be formed as connecting each other. For example, the vertical hydrogen absorbing layer MTV may include a lower vertical part and an upper vertical part. The lower vertical part may connect the first hydrogen absorbing layer MT1 and the second hydrogen absorbing layer MT2. The upper vertical part may connect the second hydrogen absorbing layer MT2 and the third hydrogen absorbing layer MT3.

The first to third hydrogen absorbing layers MT1, MT2 and MT3 and the vertical hydrogen absorbing layer MTV are for preventing penetration of hydrogen particles from the outside, and it is preferable that the first to third hydrogen absorbing layers MT1, MT2 and MT3 and the vertical hydrogen absorbing layer MTV may include a material having excellent properties of absorbing the hydrogen particles. For example, the first to third hydrogen absorbing layers MT1, MT2 and MT3 and the vertical hydrogen absorbing layer MTV may be made of molybdenum (Mo) or titanium (Ti), or an alloy metal of the molybdenum and the titanium.

For another example of the tenth embodiment, the hydrogen absorbing layer may include only any two selected from the first to third hydrogen absorbing layers MT1, MT2 and MT3. In this case, the vertical hydrogen absorbing layer MTV may be disposed between selected two hydrogen absorbing layers. For example, even though not shown in figure, the hydrogen absorbing layer may include only the first hydrogen absorbing layer MT1 and the third hydrogen absorbing layer MT3. In that case, the vertical hydrogen absorbing layer MTV may be disposed between the first hydrogen absorbing layer MT1 and the third hydrogen absorbing layer MT3.

Eleventh Embodiment

Figure 12:
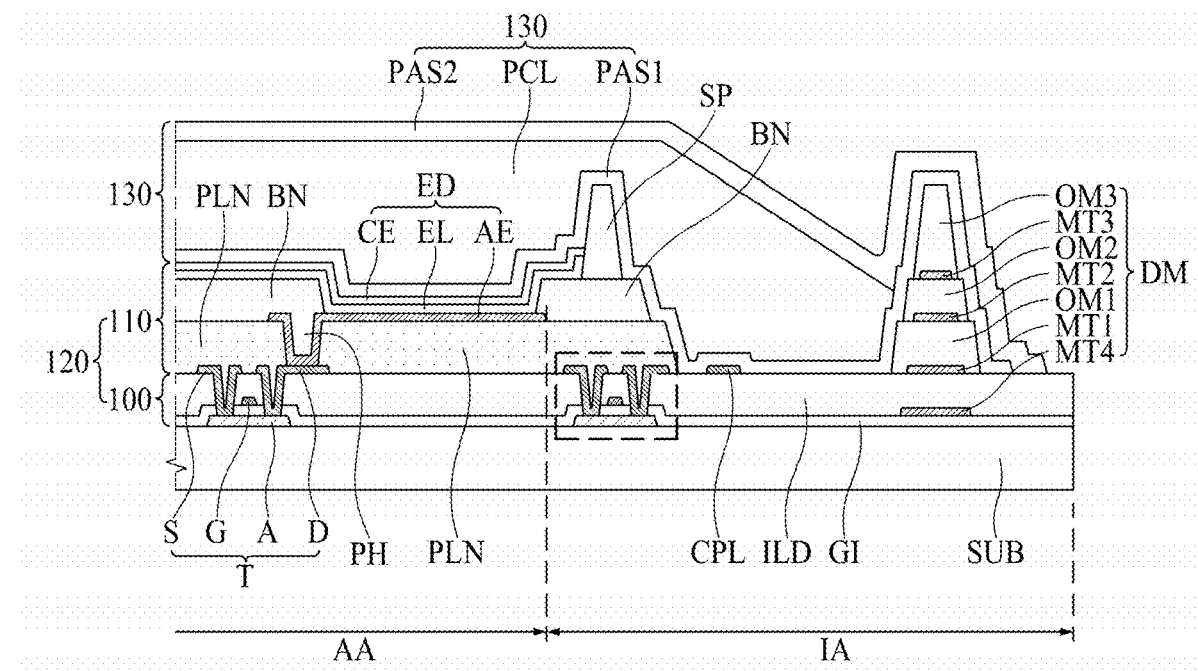
FIG. 12 is a cross-sectional view, along the cutting line I-I' in FIG. 1, illustrating a structure of an electroluminescence display device according to the eleventh embodiment of the present disclosure.

Hereinafter, referring to FIG. 12, an electroluminescence display device according to the eleventh embodiment of the present disclosure will be explained. FIG. 12 is a cross-sectional view, along the cutting line I-I' in FIG. 1, illustrating a structure of an electroluminescence display device according to the eleventh embodiment of the present disclosure.

The electroluminescence display device according to the eleventh embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

The dam DM according to the eleventh embodiment may include a first organic layer OM1, a second organic layer OM2, a third organic layer OM3, a first hydrogen absorbing layer MT1, a second hydrogen absorbing layer MT2, a third hydrogen absorbing layer MT3 and a fourth hydrogen absorbing layer MT4.

The first organic layer OM1 may be made of the same material with the planarization layer PLN at the same time for forming the planarization layer PLN. The first organic layer OM1 may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the first organic layer OM1. The inner wall side may connect the bottom side to the top side, and be facing to the display area AA. The outer wall side may connect the bottom side to the top side, and be arranged facing the outside to be symmetrical with the inner wall side.

The first hydrogen absorbing layer MT1 may be a thin film stacked between the first organic layer OM1 and the driving layer 100. For example, the first hydrogen absorbing layer MT1 may be disposed between the bottom surface of the first organic layer OM1 and the upper surface of the driving layer 100, and be covered by the first organic layer OM1, totally. In other word, the bottom surface of the first organic layer OM1 may be contact with the upper surface of the first hydrogen absorbing layer MT1 and the upper surface of the driving layer 100.

The second organic layer OM2 may be made of the same material with the bank pattern BN at the same time for forming the bank pattern BN. The second organic layer OM2 may have a trapezoid shape of which cross-sectional shape includes a bottom side, a top side, an inner wall side and an outer wall side. For example, the bottom side of the second organic layer OM2 may contact on the upper surface of the second hydrogen absorbing layer MT2 and the top side of the first organic layer OM1. The top side of the second organic layer OM2 may be parallel with the bottom side of the second organic layer OM2, and be apart from the bottom side with a predetermined height. The distance between the bottom side and the top side may be corresponding to the height of the second organic layer OM2. The inner wall side may connect the bottom side to the top side, and be facing to the display area AA. The outer wall side may connect the bottom side to the top side, and be arranged facing the outside to be symmetrical with the inner wall side.

The second hydrogen absorbing layer MT2 may be a thin film stacked between the first organic layer OM1 and the second organic layer OM2. For example, the second hydrogen absorbing layer MT2 may be disposed between the bottom side of the second organic layer OM2 and the top side of the first organic layer OM1, and be covered by the second organic layer OM2, totally.

The third organic layer OM3 may be made of the same material with the spacer SP at the same time for forming the spacer SP. The third organic layer OM3 may have a trapezoid shape of which cross-sectional shape includes a bottom side, a top side, an inner wall side and an outer wall side. For example, the bottom side of the third organic layer OM3 may contact on the top side of the second organic layer OM2. The top side of the third organic layer OM3 may be parallel with the bottom side of the third organic layer OM3, and be apart from the bottom side with a predetermined height. The distance between the bottom side and the top side may be corresponding to the height of the third organic layer OM3. The inner wall side may connect the bottom side to the top side, and be facing to the display area AA. The outer wall side may connect the bottom side to the top side, and be arranged facing the outside to be symmetrical with the inner wall side.

The third hydrogen absorbing layer MT3 may be a thin film stacked between the second organic layer OM2 and the third organic layer OM3. For example, the third hydrogen absorbing layer MT3 may be disposed between the bottom side of the third organic layer OM3 and the top side of the second organic layer OM2, and be covered by the third organic layer OM3, totally.

The fourth hydrogen absorbing layer MT4 may be disposed between two thin layers included into the driving layer 100. For example, the fourth hydrogen absorbing layer MT4 may be a thin film layer stacked between the gate insulating layer GI and the intermediate insulating layer ILD of the driving layer 100. In particular, it is preferable that the fourth hydrogen absorbing layer MT4 may be overlapped with the first hydrogen absorbing layer MT1.

For another example of the eleventh embodiment, the hydrogen absorbing layer may include only the fourth hydrogen absorbing layer MT4 and any selected one of the first hydrogen absorbing layer MT1, the second hydrogen absorbing layer MT2 and the third hydrogen absorbing layer MT3. For still another example, the hydrogen absorbing layer may include only the fourth hydrogen absorbing layer MT4 and any selected two of the first hydrogen absorbing layer MT1, the second hydrogen absorbing layer MT2 and the third hydrogen absorbing layer MT3.

Twelfth Embodiment

Figure 13:
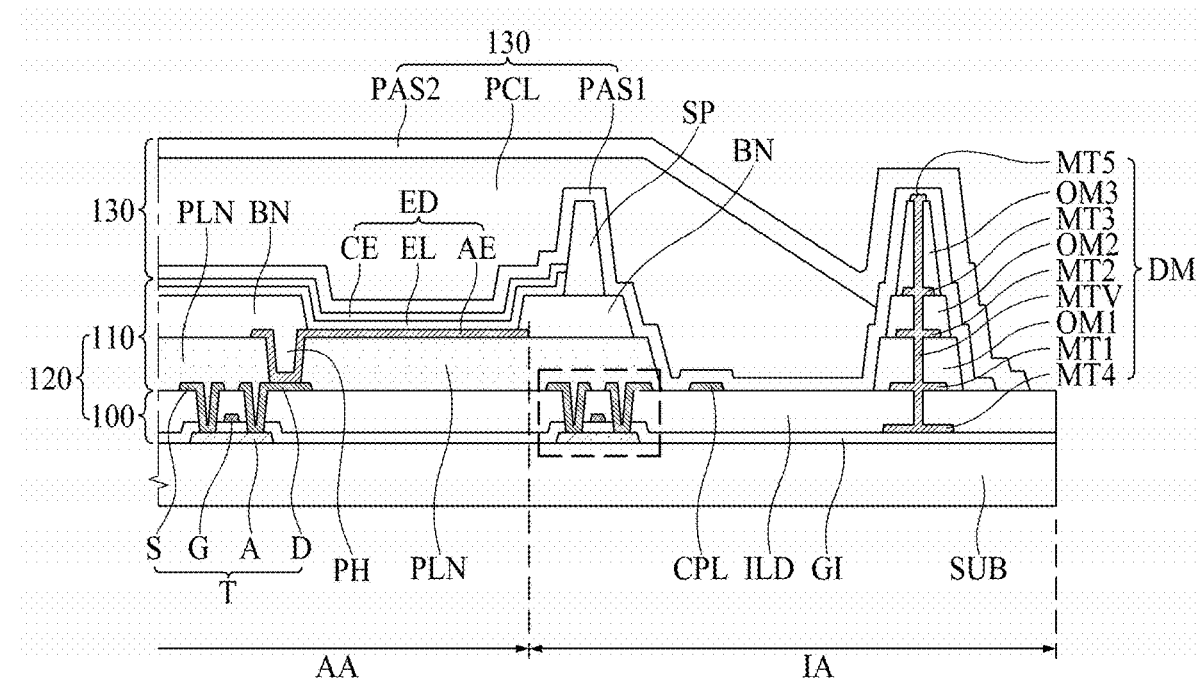
FIG. 13 is a cross-sectional view, along the cutting line I-I' in FIG. 1, illustrating a structure of an electroluminescence display device according to the twelfth embodiment of the present disclosure.

Hereinafter, referring to FIG. 13, an electroluminescence display device according to the twelfth embodiment of the present disclosure will be explained. FIG. 13 is a cross-sectional view, along the cutting line I-I' in FIG. 1, illustrating a structure of an electroluminescence display device according to the twelfth embodiment of the present disclosure.

The electroluminescence display device according to the twelfth embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

The dam DM according to the twelfth embodiment may include a first organic layer OM1, a second organic layer OM2, a third organic layer OM3, a first hydrogen absorbing layer MT1, a second hydrogen absorbing layer MT2, a third hydrogen absorbing layer MT3, a fourth hydrogen absorbing layer MT4, a fifth hydrogen absorbing layer MT5 and a vertical hydrogen absorbing layer MTV.

The first organic layer OM1 may be made of the same material with the planarization layer PLN at the same time for forming the planarization layer PLN. The first organic layer OM1 may have a trapezoid shape of which cross-sectional shape includes a bottom side, a top side, an inner wall side and an outer wall side. For example, the bottom side may contact the upper surface of the driving layer 100. The top side may be parallel with the bottom side and be apart from the bottom side with a predetermined height. The distance between the bottom side and the top side may be corresponding to the height of the first organic layer OM1. The inner wall side may connect the bottom side to the top side, and be facing to the display area AA. The outer wall side may connect the bottom side to the top side, and be arranged facing the outside to be symmetrical with the inner wall side.

The first hydrogen absorbing layer MT1 may be a thin film stacked between the first organic layer OM1 and the driving layer 100. For example, the first hydrogen absorbing layer MT1 may be disposed between the bottom surface of the first organic layer OM1 and the upper surface of the driving layer 100, and be covered by the first organic layer OM1, totally. In other word, the bottom surface of the first organic layer OM1 may be contact with the upper surface of the first hydrogen absorbing layer MT1 and the upper surface of the driving layer 100.

The second organic layer OM2 may be made of the same material with the bank pattern BN at the same time for forming the bank pattern BN. The second organic layer OM2 may have a trapezoid shape of which cross-sectional shape includes a bottom side, a top side, an inner wall side and an outer wall side. For example, the bottom side of the second organic layer OM2 may contact on the upper surface of the second hydrogen absorbing layer MT2 and the top side of the first organic layer OM1. The top side of the second organic layer OM2 may be parallel with the bottom side of the second organic layer OM2, and be apart from the bottom side with a predetermined height. The distance between the bottom side and the top side may be corresponding to the height of the second organic layer OM2. The inner wall side may connect the bottom side to the top side, and be facing to the display area AA. The outer wall side may connect the bottom side to the top side, and be arranged facing the outside to be symmetrical with the inner wall side.

The second hydrogen absorbing layer MT2 may be a thin film stacked between the first organic layer OM1 and the second organic layer OM2. For example, the second hydrogen absorbing layer MT2 may be disposed between the bottom side of the second organic layer OM2 and the top side of the first organic layer OM1, and be covered by the second organic layer OM2, totally.

The third organic layer OM3 may be made of the same material with the spacer SP at the same time for forming the spacer SP. The third organic layer OM3 may have a trapezoid shape of which cross-sectional shape includes a bottom side, a top side, an inner wall side and an outer wall side. For example, the bottom side of the third organic layer OM3 may contact on the top side of the second organic layer OM2. The top side of the third organic layer OM3 may be parallel with the bottom side of the third organic layer OM3, and be apart from the bottom side with a predetermined height. The distance between the bottom side and the top side may be corresponding to the height of the third organic layer OM3. The inner wall side may connect the bottom side to the top side, and be facing to the display area AA. The outer wall side may connect the bottom side to the top side, and be arranged facing the outside to be symmetrical with the inner wall side.

The third hydrogen absorbing layer MT3 may be a thin film stacked between the second organic layer OM2 and the third organic layer OM3. For example, the third hydrogen absorbing layer MT3 may be disposed between the bottom side of the third organic layer OM3 and the top side of the second organic layer OM2, and be covered by the third organic layer OM3, totally.

The fourth hydrogen absorbing layer MT4 may be disposed between two thin layers included into the driving layer 100. For example, the fourth hydrogen absorbing layer MT4 may be a thin film layer stacked between the gate insulating layer GI and the intermediate insulating layer ILD of the driving layer 100. In particular, it is preferable that the fourth hydrogen absorbing layer MT4 may be overlapped with the first hydrogen absorbing layer MT1.

The fifth hydrogen absorbing layer MT5 may be a thin film layer disposed on the top side of the third organic layer OM3. For example, the fifth hydrogen absorbing layer MT5 may be disposed between the top side of the third organic layer OM3 and the first inorganic encapsulation layer PAS1 of the encapsulation layer 130.

The vertical hydrogen absorbing layer MTV may have a vertical wall sheet shape penetrating the middle portions of the intermediate insulating layer ILD, the first organic layer OM1, the second organic layer OM2 and the third organic layer OM3 between the fifth hydrogen absorbing layer MT5 and the fourth hydrogen absorbing layer MT4. For example, the vertical hydrogen absorbing layer MTV may be a thin film filling the vertical through-hole penetrating from the top side of the third organic layer OM3 to the lower surface of the intermediate insulating layer ILD.

The first to fifth hydrogen absorbing layers MT1, MT2, MT3, MT4 and MT5 and the vertical hydrogen absorbing layer MTV may be formed as being connected each other. For example, the vertical hydrogen absorbing layer MTV may include a first vertical part, a second vertical part, a third vertical part and a fourth vertical part. The first vertical part may connect the first hydrogen absorbing layer MT1 and the second hydrogen absorbing layer MT2. The second vertical part may connect the second hydrogen absorbing layer MT2 and the third hydrogen absorbing layer MT3. The third vertical part may connect the third hydrogen absorbing layer MT3 and the fourth hydrogen absorbing layer MT4. The fourth vertical part may connect the fourth hydrogen absorbing layer MT4 and the fifth hydrogen absorbing layer MT5. Alternately, one or some of the first to fourth vertical part may be omitted.

The first to fifth hydrogen absorbing layers MT1, MT2, MT3, MT4 and MT5 and the vertical hydrogen absorbing layer MTV are for preventing penetration of hydrogen particles from the outside, and it is preferable that the first to fifth hydrogen absorbing layers MT1, MT2, MT3, MT4 and MT5 and the vertical hydrogen absorbing layer MTV may include a material having excellent properties of absorbing the hydrogen particles. For example, the first to fifth hydrogen absorbing layers MT1, MT2, MT3, MT4 and MT5 and the vertical hydrogen absorbing layer MTV may be made of molybdenum (Mo) or titanium (Ti), or an alloy metal of the molybdenum and the titanium.

For another example of the twelfth embodiment, the hydrogen absorbing layer may include only the fourth hydrogen absorbing layer MT4, the vertical hydrogen absorbing layer MTV and any selected one of the first to third hydrogen absorbing layers MT1, MT2 and MT3. In this case, the vertical hydrogen absorbing layer MTV may have a connecting structure between the fourth hydrogen absorbing layer MT4 and any selected one of the first to third hydrogen absorbing layers MT1, MT2 and MT3. For still another example, the hydrogen absorbing layer may include only the fourth hydrogen absorbing layer MT4, the vertical hydrogen absorbing layer MTV and any selected two of the first to third hydrogen absorbing layers MT1, MT2 and MT3. In that case, the vertical hydrogen absorbing layer MTV may connect between the fourth hydrogen absorbing layer MT4 and the topmost hydrogen absorbing layer.

Thirteenth Embodiment

Figure 14:
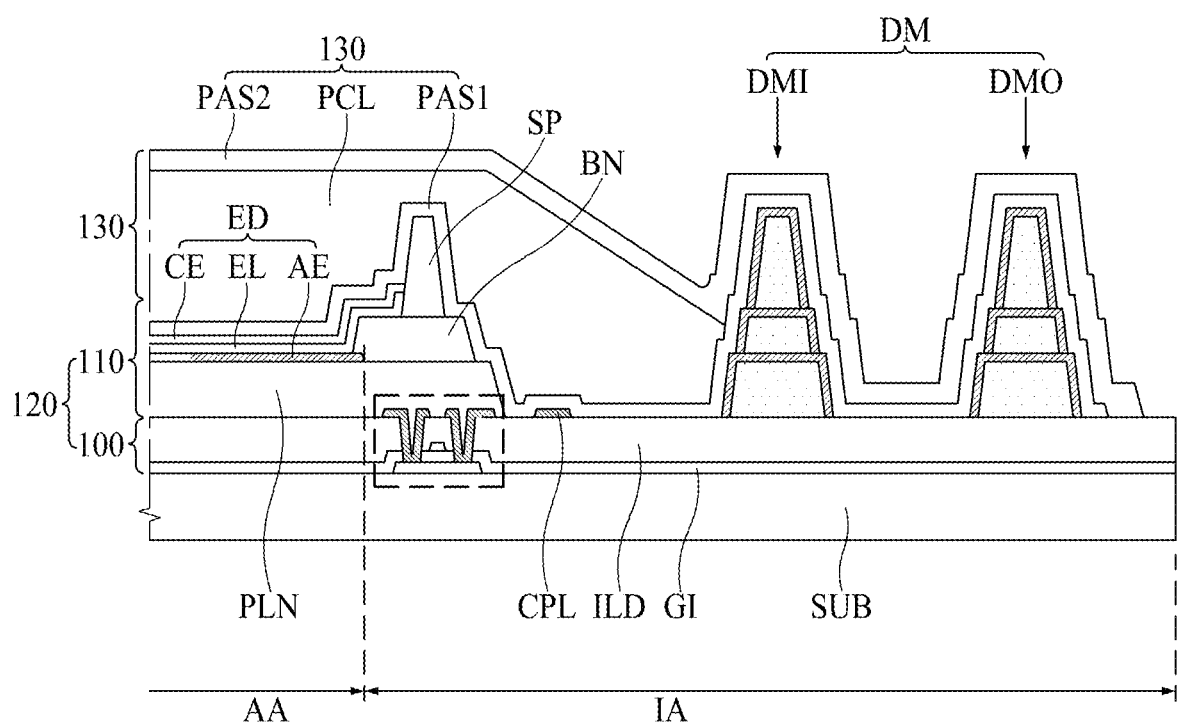
FIG. 14 is a cross-sectional view, along the cutting line I-I' in FIG. 1, illustrating a structure of an electroluminescence display device according to the thirteenth embodiment of the present disclosure.

Hereinafter, referring to FIG. 14, an electroluminescence display device according to the thirteenth embodiment of the present disclosure will be explained. FIG. 14 is a cross-sectional view, along the cutting line I-I' in FIG. 1, illustrating a structure of an electroluminescence display device according to the thirteenth embodiment of the present disclosure.

The electroluminescence display device according to the thirteenth embodiment may have very similar structure with the first embodiment. There may be a difference at the structure and/or shape of the dam DM. therefore, the explanation will be focused on the structure and/or shape of the dam DM, but the same description may not be duplicated. When it is required, the explanation of the first embodiment may be referred.

The dam DM according to the thirteenth embodiment of the present disclosure may include an inner dam DMI and an outer dam DMO. The inner dam DMI may be disposed as being closer to the display area AA than the outer dam DMO and surrounding the display area AA. The outer dam DMO may be disposed at the outside of the inner dam DMI as surrounding the inner dam DMI.

Each of the inner dam DMI and the outer dam DMO shown in FIG. 14 are illustrated as having the same structure of the dam DM according to the fifth embodiment of the present disclosure shown in FIG. 6. However, it is not limited thereto, each of the inner dam DMI and the outer dam DMO may have the same shape and structure the same with any selected one structure of the first to twelfth embodiments. Further, the inner dam DMI and the outer dam DMO may have various structure in which they are combined with any selected two structure of the first to twelfth embodiments.

Features, structures, effects and so on described in the above described examples of the present disclosure are included in at least one example of the present disclosure, and are not necessarily limited to only one example. Furthermore, features, structures, effects and so on exemplified in at least one example of the present disclosure may be implemented by combining or modifying other examples by a person having ordinary skilled in this field. Therefore, contents related to such combinations and modifications should be interpreted as being included in the scope of the present application.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
a substrate;
a driving layer disposed on the substrate;
an emission layer disposed on the driving layer;
a dam surrounding a circumference area of the emission layer, the dam including an organic layer and a hydrogen absorbing layer for absorbing hydrogen particles intruding from outside of the dam and blocking the hydrogen particles from propagating into an interior of the display; and
an encapsulation layer disposed on the emission layer and the dam,
wherein the hydrogen absorbing layer comprises a vertical hydrogen absorbing layer extending vertically through a middle portion of the organic layer,
wherein the organic layer includes:
a first organic layer;
a second organic layer on the first organic layer; and
a third organic layer on the second organic layer,
wherein the hydrogen absorbing layer includes:
a first hydrogen absorbing layer disposed on the driving layer;
a second hydrogen absorbing layer disposed on the first organic layer; and
a third hydrogen absorbing layer disposed on the second organic layer, and covered by the third organic layer,
wherein the first hydrogen absorbing layer is fully covered by the first organic layer,
wherein the second hydrogen absorbing layer is fully covered by the second organic layer, and
wherein the vertical hydrogen absorbing layer connects the first hydrogen absorbing layer and the second hydrogen absorbing layer.

2. The electroluminescence display according to claim 1, wherein the vertical hydrogen absorbing layer connects the first hydrogen absorbing layer and the third hydrogen absorbing layer, and penetrating a middle portion of the first organic layer and the second organic layer.

3. The electroluminescence display according to claim 1, wherein the organic layer includes:
a bottom side contacting an upper surface of the driving layer;
a top side apart from the bottom side with a predetermined height;
an inner wall side connecting the bottom side and the top side; and
an outer wall side connecting the bottom side and the top side, and facing to the inner wall side,
wherein the hydrogen absorbing layer has a vertical wall sheet shape penetrating the organic layer from the top side to the bottom side and contacting an upper surface of the driving layer.

* * * * *